(12) United States Patent
Higuma et al.

(10) Patent No.: US 8,230,083 B2
(45) Date of Patent: Jul. 24, 2012

(54) COMMUNICATION ADAPTER APPARATUS, COMMUNICATION ADAPTER, METHOD OF WRITING DATA IN NONVOLATILE MEMORY, AND ELECTRIC APPARATUS AND ROM WRITER USED FOR THE METHOD

(75) Inventors: Toshiyasu Higuma, Tokyo (JP); Noriyuki Kushiro, Tokyo (JP); Yoshiaki Ito, Tokyo (JP); Yoshiko Ochiai, Tokyo (JP); Yoshiaki Koizumi, Tokyo (JP)

(73) Assignee: Mitsubishi Denki Kabushiki Kaisha, Chiyoda-ku, Tokyo (JP)

( * ) Notice: Subject to any disclaimer, the term of this patent is extended or adjusted under 35 U.S.C. 154(b) by 327 days.

(21) Appl. No.: 10/529,869

(22) PCT Filed: Oct. 1, 2003

(86) PCT No.: PCT/JP03/12600
§ 371 (c)(1),
(2), (4) Date: Oct. 4, 2005

(87) PCT Pub. No.: WO2004/032425
PCT Pub. Date: Apr. 15, 2004

(65) Prior Publication Data
US 2006/0168236 A1     Jul. 27, 2006

(30) Foreign Application Priority Data

Oct. 2, 2002   (JP) ................................ 2002-289469
Oct. 3, 2002   (JP) ................................ 2002-290868
Mar. 11, 2003  (JP) ................................ 2003-064423

(51) Int. Cl.
*G06F 15/16* (2006.01)

(52) U.S. Cl. ........................................................ 709/229
(58) Field of Classification Search .................. 709/227, 709/229, 250
See application file for complete search history.

(56) References Cited

U.S. PATENT DOCUMENTS 5,544,036 A * 8/1996 Brown et al. ............. 340/825.24
5,570,085 A * 10/1996 Bertsch .......................... 340/3.54
6,347,338 B1 * 2/2002 Segal ............................. 709/229
(Continued)

FOREIGN PATENT DOCUMENTS
JP             1-228395 A      9/1989
(Continued)

OTHER PUBLICATIONS

"ECHONET", Echonet Specification Version 1.0, May 18, 2000, pp. 3-1 to 3-3.

(Continued)

*Primary Examiner* — Jason Recek
(74) *Attorney, Agent, or Firm* — Buchanan Ingersoll & Rooney PC

(57) ABSTRACT

A communication adapter apparatus connects electrical apparatuses, sensors, and other apparatuses to a network. In order to obtain a communication adapter apparatus that is capable of realizing simplification of setting at the time of execution of works, simplification of execution of works, reduction of power consumption, and simplification of system setting, the communication adapter apparatus is a communication adapter that connects one of plural connection object apparatuses having an apparatus object consisting of information, which is based on functions of the apparatuses, and operable control items, respectively and a network to which a controller for remotely controlling the connection object apparatus is connected.

10 Claims, 21 Drawing Sheets

U.S. PATENT DOCUMENTS

| | | | |
|---|---|---|---|
| 6,437,685 B2* | 8/2002 | Hanaki | 340/286.02 |
| 6,567,007 B1* | 5/2003 | Fritsche et al. | 340/653 |
| 6,728,804 B1* | 4/2004 | Howard et al. | 710/62 |
| 6,880,076 B2* | 4/2005 | Greiner et al. | 713/1 |
| 6,906,617 B1* | 6/2005 | Van der Meulen | 340/538 |
| 7,032,018 B2* | 4/2006 | Lee et al. | 709/223 |
| 7,075,670 B1* | 7/2006 | Koga | 358/1.15 |
| 2002/0072391 A1* | 6/2002 | Itoh et al. | 455/557 |
| 2002/0196158 A1* | 12/2002 | Lee | 340/825.69 |
| 2003/0088796 A1* | 5/2003 | Abdulkarim | 713/300 |
| 2003/0097452 A1* | 5/2003 | Kim et al. | 709/229 |
| 2003/0100962 A1* | 5/2003 | Sumita et al. | 700/65 |
| 2003/0107476 A1* | 6/2003 | Sahinoglu et al. | 340/310.01 |
| 2003/0120753 A1* | 6/2003 | Ebert | 709/219 |
| 2003/0179746 A1* | 9/2003 | Moon et al. | 370/352 |
| 2003/0210658 A1* | 11/2003 | Hernandez et al. | 370/311 |
| 2003/0233201 A1* | 12/2003 | Horst et al. | 702/62 |
| 2004/0088590 A1* | 5/2004 | Lee et al. | 713/300 |
| 2005/0005167 A1* | 1/2005 | Kelly et al. | 713/201 |
| 2006/0142900 A1* | 6/2006 | Rothman et al. | 700/295 |

FOREIGN PATENT DOCUMENTS

| | | |
|---|---|---|
| JP | 2-130799 A | 5/1990 |
| JP | 6-068097 A | 3/1994 |
| JP | 8-204783 A | 8/1996 |
| JP | 09-018974 A | 1/1997 |
| JP | 9-018974 A | 1/1997 |
| JP | 9-160766 A | 6/1997 |
| JP | 10-145400 A | 5/1998 |
| JP | 2000-172509 A | 6/2000 |
| JP | 2000-244981 A | 9/2000 |
| JP | 2000-253001 A | 9/2000 |
| JP | 2000-298585 A | 10/2000 |
| JP | 2001-053779 A | 2/2001 |
| JP | 2002-044745 A | 2/2002 |
| JP | 2002-063071 A | 2/2002 |
| JP | 2002-095071 A | 3/2002 |

OTHER PUBLICATIONS

Japan Office Action, with English-language Translation, dated Dec. 18, 2007.

* cited by examiner

COMMUNICATION ADAPTER APPARATUS, COMMUNICATION ADAPTER, METHOD OF WRITING DATA IN NONVOLATILE MEMORY, AND ELECTRIC APPARATUS AND ROM WRITER USED FOR THE METHOD

TECHNICAL FIELD

The present invention relates to a communication adapter apparatus that connects electrical apparatuses, sensors, and other apparatuses to a network, an electrical apparatus incorporating an electrically rewritable nonvolatile memory, a ROM writer that writes data in this nonvolatile memory, and a writing method using the foregoing.

BACKGROUND ART

As described in JP-A-2002-44745 (page 5, paragraph 0050, and FIG. 1) and ECHONET specification Ver1.10 (Section 7, page 3-1) issued by the ECHONET consortium, a conventional communication adapter apparatus is constituted by only a communication unit that communicates control signals for remote control. Functions for interpretation of the control signals and management of system information are mounted on home appliance control units in home appliances.

In addition, as described in ECHONET specification Ver1.10 (Section 1, page 4-4, FIG. 4-1, form 4) issued by the ECHONET consortium, the conventional communication adapter apparatus incorporates a converting function for existing communication interfaces having different specifications for each apparatus to realize remote control.

Further, as described in JP-A-01-228395 (page 3 and FIG. 2), in a conventional domestic control system, when attribute information (model names, power consumption, etc.) concerning loads such as air conditioners and lights are set in a communication adapter or when the attribute information set in the communication adapter is changed because of extension or the like of the system, code numbers of the loads have to be set using a DIP code switch every time the attribute information is changed. Since such setting using the DIP code switch is complicated work, as described in JP-A-06-68097 (FIG. 1), a domestic control system, which sets code numbers in a communication adapter using barcodes and a barcode reader, has been proposed.

As described in JP-A-2-130799 (FIG. 1), in a method of writing data in a nonvolatile memory, when a ROM writer is connected to a terminal apparatus via connecting means, a STBY terminal of an MPU in the terminal apparatus is connected to a ground terminal in the ROM writer. This brings the terminal apparatus into a standby state and makes it possible to write a program in the terminal apparatus. Thus, update of the program for an EEPROM can be performed without soldering work.

However, since the conventional communication adapter apparatus does not have common interface mean to communication control means, there is a problem in that the communication control means cannot be changed according to a type of a network.

Since it is necessary to incorporate communication management and control programs for remote control in a control device in an apparatus, there is a problem in that burdens on resources such as microcomputers and cost of the resources increase.

Since the communication adapter is required to function together with an apparatus, there is a problem in that various kinds of system setting cannot be performed unless all apparatuses come into an operating state at the time of execution of works.

Since an adapter itself holds communication installation information, when the adapter is replaced because of a failure or the like, there is a problem in that complicated work of resetting for the adapter involved in resetting for a system is required.

When abnormality of the system occurs, since a control function is incorporated in the apparatus, there is a problem in that it is difficult to judge whether the adapter is abnormal or the apparatus is broken down.

When it is attempted to have power supply from home appliances for simplification of execution of works, there no function for power supply management and no means for providing and controlling information and there is no means for controlling functions of respective units. Thus, there is a problem in that it is essential to supply power to the respective units constituting the communication adapter and cost of power supply circuits of the home appliances increases.

For the setting of attribute information such as model names and power consumption of connected home appliances and the change of setting involved in extension of the system, the barcodes and the barcode reader are required and time and labor consuming work using the barcodes and the barcode reader is required.

Since only the ground terminal is disposed in the ROM writer, the conventional ROM writer, the conventional electrical apparatus, and the conventional writing method using the ROM writer and the electrical apparatuses can be applied to an apparatus incorporating a microcomputer that changes to a writing mode when the microcomputer is pulled down to a ground level but cannot be applied to an apparatus incorporating a microcomputer that changes to a writing mode when the microcomputer is pulled up to a predetermined voltage. As a result, in writing, it is necessary to provide a ROM writer according to specifications of a microcomputer incorporated in the apparatus.

The invention has been devised in order to solve such problems and it is an object of the invention to provide a communication adapter apparatus that gives common interface means to communication control means and is capable of changing the communication control means according to a type of a network.

It is another object of the invention to provide a communication adapter apparatus for home appliances connectable to a network with little burden on resources such as microcomputers of the home appliances and little increase in cost of the resources.

It is still another object of the invention to provide a communication adapter apparatus for which execution of works is simplified and it is possible to perform various kinds of system setting without connecting home appliances in an operating state to the communication adapter apparatus.

It is still another object of the invention to provide a communication adapter apparatus that does not require complicated work such as system resetting at the time of replacement of the communication adapter and is replaceable easily.

It is still another object of the invention to provide a communication adapter apparatus that, when system abnormality occurs, makes it possible to judge whether an adapter is abnormal or a home appliance is broken down.

It is still another object of the invention to provide a communication adapter apparatus for connecting home appliances through a network while saving power and without increasing cost of power supply to the home appliances to be connected.

It is still another object of the invention to provide a communication adapter that can automatically set attribute information on home appliances without using barcodes and a barcode reader and, even if the attribute information is changed, can change the attribute information easily without using the barcodes and the barcode reader.

It is still another object of the invention to provide a ROM writer and an electrical apparatus with high universality that can be used regardless of specifications of microcomputers, and a writing method using the ROM write and the electrical apparatus.

DISCLOSURE OF THE INVENTION

A communication adapter apparatus according to the invention is a communication adapter that connects one of plural connection object apparatuses having an apparatus object consisting of information, which is based on functions of the apparatuses, and operable control items, respectively and a network to which a controller for remotely controlling the connection object apparatus is connected, the communication adapter including: communication control means that controls transmission and reception of data to and from the network; apparatus communication managing means that copies and saves the apparatus object, saves a procedure for a communication service of the communication control means, and makes it possible to use the connection object apparatus from the network using these saved data; and apparatus interface means that is defined by standards common to all the apparatuses in order to make all the plural communication object apparatuses connectable.

The communication adapter apparatus according to the invention further includes power supply managing means that manages a charged capacity inside an adapter, wherein the communication control means limits communication according to a management state of the power supply managing means.

The communication adapter apparatus according to the invention further includes power supply managing means that manages a charged capacity inside an adapter, wherein the apparatus communication managing means limits accesses to the apparatus object according to a management state of the power supply managing means.

In the communication adapter apparatus according to the invention, the apparatus communication managing means includes: an apparatus interface access unit that is usable according to a procedure common to the connection object apparatuses; and an apparatus control access unit that is usable from the communication control means according to the common procedure and also includes at least one of permitting/prohibiting means that permits or prohibits an access to the apparatus interface access unit from the communication control unit and permitting/prohibiting means that permits or prohibits an access to the apparatus control access unit from the apparatus interface means.

In the communication adapter apparatus according to the invention, the apparatus communication managing means includes: an apparatus interface access unit that is usable according to a procedure common to the connection object apparatuses; and an apparatus control access unit that is usable from the communication control means according to the common procedure, and each of the apparatus interface access unit and the apparatus control access unit includes at leas one of object managing means that performs management such as generation, deletion, and addition of instances and classes of the apparatus object, state acquisition procedure setting means that sets setting values held by the connection object apparatuses, a procedure for acquiring a state, a state change, a periodical notification, and the like, installation information managing means that sets and provides information on installation or arrangement of the connection object apparatuses, network attribute managing means that sets and provides attribute information concerning the network, and network band managing means that sets and provides information related to a communication band of the network.

In the communication adapter apparatus according to the invention, the apparatus communication managing means is means that, when the connection object apparatuses are not connected yet, generates an imaginary apparatus object on the basis of a setting command, transmission of which is received via the network, and saves the imaginary apparatus object instead of the apparatus object.

In the communication adapter apparatus according to the invention, the apparatus communication managing means includes: an apparatus interface access unit that is usable according to a procedure common to the connection object apparatuses; and an apparatus control access unit that is usable from the communication control means according to the common procedure, and the apparatus communication managing means provides an imaginary apparatus in the apparatus control access unit on the basis of a setting command, transmission of which is received via the network, performs operation and setting for this imaginary apparatus and acquisition of a state involved in the operation and setting, and performs setting for running and stop of the apparatus object and acquisition of a state involved in the setting with the apparatus interface access unit.

In the communication adapter apparatus according to the invention, the apparatus communication managing means includes: an apparatus interface access unit that is usable according to a procedure common to the connection object apparatuses; an apparatus control access unit that is usable from the communication control means according to the common procedure; and a database that holds installation information for the apparatus object and the like, and each of the apparatus interface access unit and the apparatus control access unit includes writing/reading means that writes the installation information held by the database in and reads out the installation information to the connection object apparatuses.

The communication adapter apparatus according to the invention includes: an apparatus interface access unit that is usable according to a procedure common to the connection object apparatuses; and an apparatus control access unit that is usable from the communication control means according to the common procedure, and each of the apparatus interface access unit and the apparatus control access unit includes abnormality notifying means that detects in which of the apparatus interface, the communication control means, the network interface means, and the apparatus object abnormality has occurred and provides the network or the connection object apparatuses with information on the detected abnormality.

The communication adapter apparatus according to the invention provides the network with the abnormality information when data transmission through the network is possible and provides the connection object apparatuses with the abnormality information when data transmission through the network is impossible.

In the communication adapter apparatus according to the invention, the apparatus communication managing means includes: an apparatus interface access unit that is usable according to a procedure common to the connection object apparatuses; and an apparatus control access unit that is usable from the communication control means according to the common procedure, and the apparatus communication managing means limits communication applies limitation on communication to the communication control means according to a state of the power supply managing means using at least one of the apparatus interface access unit and the apparatus control access unit.

A communication adapter according to the invention includes: an input/output interface that is connected to a home appliance; a network interface that is connected to a network; a CPU that is connected to the interfaces and performs exchange and processing of data; and a storage that saves the data, wherein the storage has plural pieces of driver software for controlling hardware of the input/output interface for each input/output system and, when the input/output interface is connected to the home appliance, the CPU distinguishes an input/output system for the home appliance on the basis of voltage information supplied from the home appliance via a specific terminal of the input/output interface and selects driver software corresponding to the input/output system.

A communication adapter according to the invention includes: an input/output interface that is connected to a home appliance; a network interface that is connected to a network; a CPU that is connected to the interfaces and performs exchange and processing of data; and a storage that saves the data, wherein the storage has plural pieces of driver software for controlling hardware of the input/output interface for each input/output system, the input/output interface includes a second specific terminal that supplies a clock signal from the communication adapter to the home appliance, and the CPU starts driver software of a serial input/output system of a clock synchronous type/asynchronous type in association with supply/non-supply of the clock signal and, on the basis of a response returned from the home appliance at this point, selects driver software of the serial input/output system of one of the clock synchronous type/asynchronous type.

A communication adapter according to the invention includes: an input/output interface that is connected to a home appliance; a network interface that is connected to a network; a CPU that is connected to the interfaces and performs exchange and processing of data; and a storage that saves the data, wherein the storage has plural pieces of driver software for controlling hardware of the input/output interface for each input/output system, and the communication adapter selects driver software held by the storage on the basis of a communication frame that is sent from an electrical apparatus connected to the network.

A communication adapter according to the invention includes: an input/output interface that is connected to a home appliance; a network interface that is connected to a network; a CPU that is connected to the interfaces and performs exchange and processing of data; and a storage that saves the data, wherein the storage has plural pieces of driver software for controlling hardware of the input/output interface for each input/output system, the storage holds attribute information consisting of items, model names, power consumption, and the like, which can be monitored, controlled, and set from the network, for each of plural home appliances, and the communication adapter selects one piece of the attribute information for the input/output interface on the basis of a response frame from the home appliance responding to the communication frame sent from the input/output interface to the home appliance.

A communication adapter according to the invention includes: an input/output interface that is connected to a home appliance; a network interface that is connected to a network; a CPU that is connected to the interfaces and performs exchange and processing of data; and a storage that saves the data, wherein the storage has plural pieces of driver software for controlling hardware of the input/output interface for each input/output system, the storage holds attribute information consisting of items, model names, power consumption, and the like, which can be monitored, controlled, and set from the network, for each of plural home appliances, and the communication adapter selects one piece of the attribute information on the basis of a communication frame sent from an electrical apparatus connected to the network.

A method of writing data in a nonvolatile memory according to the invention is a writing method consisting of an electrical apparatus incorporating a nonvolatile memory in which data is rewritable when a writing control terminal is pulled down or pulled up to a predetermined voltage; and a ROM writer that writes data in this nonvolatile memory, wherein the electrical apparatus includes a generation circuit for generating the predetermined voltage and the ROM writer includes means that connects the predetermined voltage generated by the generation circuit to the writing control terminal.

The electrical apparatus constituting the method of writing data in a nonvolatile memory according to the invention has an interface including the writing control terminal and a voltage terminal that outputs the predetermined voltage generated by the generation circuit.

The ROM writer connected to the electrical apparatus constituting the method of writing data in a nonvolatile memory according to the invention has an interface including means can be connected to the interface and short-circuits the writing control terminal and the voltage terminal when the means is connected to the interface.

A method of writing data in a nonvolatile memory according to the invention is a writing method consisting of an electrical apparatus incorporating a nonvolatile memory in which data is rewritable when a writing control terminal is pulled down or pulled up to a predetermined voltage; and a ROM writer that writes data in this nonvolatile memory, wherein the electrical apparatus has an interface including the writing control terminal and a setting circuit for setting the writing control terminal to the predetermined voltage, and the ROM writer has an interface including trigger means that can be connected to the interface and turns ON the setting circuit when the trigger means is connected to the interface.

The electrical apparatus constituting the method of writing data in a nonvolatile memory according to the invention, wherein the setting circuit is a circuit unit consisting of a light-receiving element that turns ON/OFF an operation for setting the writing control terminal to the predetermined voltage according to whether the light-receiving element receives light of a specific wavelength exceeding a predetermined intensity.

The ROM writer connected to the electrical apparatus constituting the method of writing data in a nonvolatile memory according to the invention, wherein the trigger unit is a circuit unit consisting of a light-emitting element that irradiate light of a specific wavelength on the light-receiving element.

The electrical apparatus constituting the method of writing data in a nonvolatile memory according to the invention, wherein the setting circuit is a circuit unit consisting of a relay for turning ON/OFF an operation for setting the writing control terminal to the predetermined voltage according to whether the relay gives a specific current to a coil control line.

The ROM writer connected to the electrical apparatus constituting the method of writing data in a nonvolatile memory according to the invention, wherein the trigger unit is a circuit unit including a voltage terminal that gives a specific current to the coil control line.

The electrical apparatus constituting the method of writing data in a nonvolatile memory according to the invention, wherein the setting circuit is a circuit unit consisting of a mechanism switch that turns ON/OFF an operation for setting the writing control terminal to the predetermined voltage according to whether the mechanism switch is pushed in.

The ROM writer connected to the electrical apparatus constituting the method of writing data in a nonvolatile memory according to the invention, wherein the trigger unit is a projection for pushing in the mechanism switch.

The electrical apparatus constituting the method of writing data in a nonvolatile memory according to the invention, wherein the setting circuit is a circuit unit consisting of a thermostatic lead switch that turns ON/OFF an operation for setting the writing control terminal to the predetermined voltage according to whether the thermostatic lead switch is heated.

The ROM writer connected to the electrical apparatus constituting the method of writing data in a nonvolatile memory according to the invention, wherein the trigger means is a heater for heating the thermostatic lead switch.

The electrical apparatus constituting the method of writing data in a nonvolatile memory according to the invention, wherein the setting circuit is a circuit unit consisting of a magnetic lead switch that turns ON/OFF an operation for setting the writing control terminal to the predetermined voltage according to whether magnetism is applied to the magnetic lead switch.

The ROM writer connected to the electrical apparatus constituting the method of writing data in a nonvolatile memory according to the invention, wherein the trigger unit is a magnet or an electromagnet for applying magnetism to the magnetic lead switch.

A method of writing data in a nonvolatile memory according to the invention is a writing method consisting of an electrical apparatus incorporating a nonvolatile memory in which data is rewritable when a writing control terminal is pulled down or pulled up to a predetermined voltage; and a ROM writer that rewrites data in this nonvolatile memory, wherein the electrical apparatus includes, in an interface, the writing control terminal; switching means that switches the writing control terminal to the predetermined voltage; a signal terminal; and separating means that separates a signal inputted to the signal terminal into a data signal for writing and a trigger signal for controlling the switching means, and the ROM writer includes an interface including means that can be connected to the interface and outputs a synthesized data signal, which is obtained by synthesizing the data signal for writing and the trigger signal for controlling the switching means, to the signal terminal when the means is connected to the interface.

The electrical apparatus constituting the method of writing data in a nonvolatile memory according to the invention, wherein the separating means includes a low-pass filter and the switching means includes a flip-flop.

The ROM writer connected to the electrical apparatus constituting the method of writing data in a nonvolatile memory according to the invention, wherein the synthesized data signal is a logical product of the data signal for writing and a clock signal.

The ROM writer connected to the electrical apparatus constituting the method of writing data in a nonvolatile memory according to the invention, wherein the synthesized data signal is a signal in which a start bit signal and the data signal for writing are arranged in this order.

BEST MODE FOR CARRYING OUT THE INVENTION

First Embodiment

Figure 1:
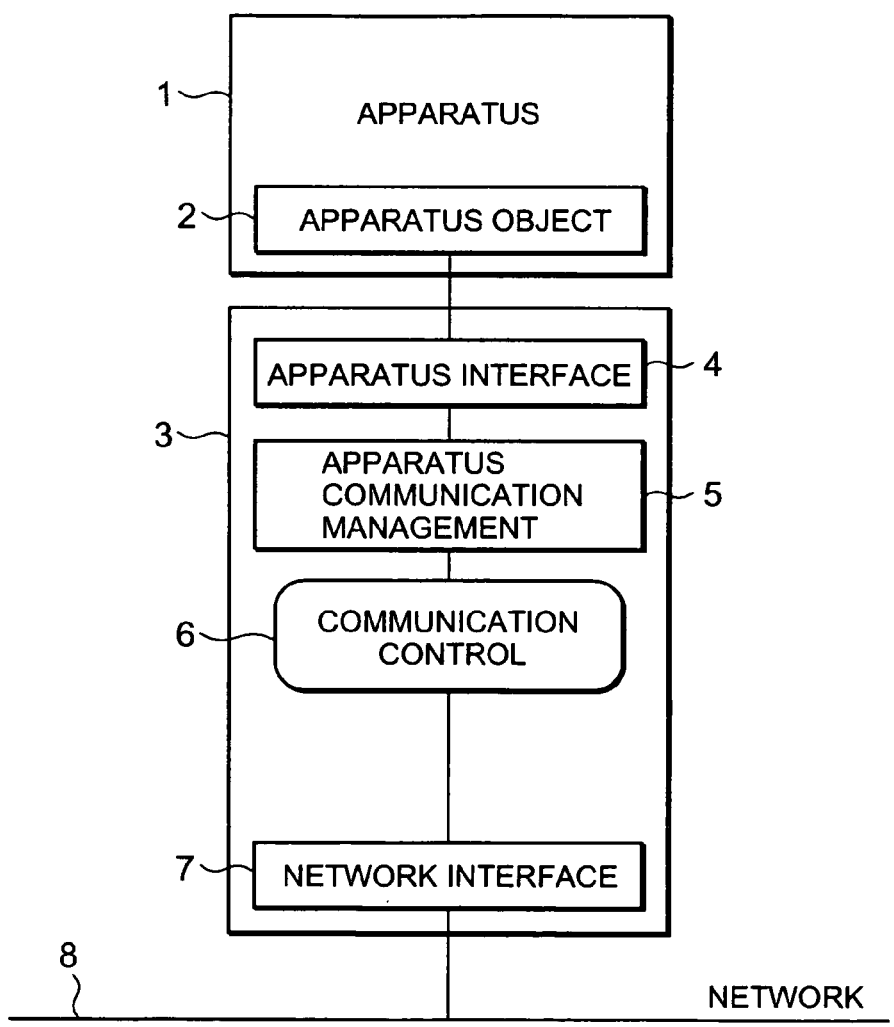
FIG. 1 is a block diagram of a communication adapter apparatus according to a first embodiment of the invention.

FIG. 1 is a block diagram showing an internal structure of a communication adapter apparatus according to a first embodiment of the invention.

In the figure, an apparatus 1 is a home appliance, a sensor apparatus, or the like and has an apparatus object 2 consisting of information peculiar to the apparatus and operable control items.

A communication adapter apparatus 3 can use the apparatus object 2 in the apparatus 1 via apparatus interface means 4 that is commonly defined for the apparatus 1.

Apparatus communication managing means has functions for setting and operation of the apparatus object 2 held by the apparatus 1 and other management functions and is connected to communication control means 6 according to a predetermined procedure for use.

The communication control means 6 has a control function concerning communication for, via network interface means 7 and a network 8, transmitting and receiving data to and from another apparatus connected to the network.

An operation of the communication control means 6 will be explained next.

A case in which an operation command is transmitted to the apparatus 1 connected to the network 8 by the communication adapter apparatus 3 from another apparatus connected to the network will be explained.

The network interface means 7 receives an operation command from the network 8 and passes the operation command to the communication control means 6. The communication control means 6 carries out various procedures for reception in association with the network interface 7. Then, the communication control means converts the acquired operation command into a predetermined format in order to pass the operation command to apparatus communication managing means 5, performs a predetermined procedure, and passes the operation command to the apparatus communication managing means 5. The apparatus communication managing means 5 analyzes the operation command and changes setting for control items of the apparatus object 2 in the apparatus 1 using an apparatus interface 4 in order to set a control item of the apparatus object 2 corresponding to the operation command.

The apparatus 1 detects that the setting for the control item of the apparatus object 2 has been changed and, after carrying out operation corresponding to the control item, changes an information item changed by the operation. Here, a series of operation according to the operation command is completed.

Next, an operation in notifying another apparatus connected to the network that the information item of the apparatus object 2 of the apparatus 1 has been changed will be explained. The apparatus communication managing means 5 periodically monitors information items of the apparatus object 2 using the apparatus interface means 4. When a change in the information items is detected, the apparatus communication managing means 5 generates a command notifying the change in the information items, creates the command in a predetermined format, executes a predetermined processing in association with the communication control means 6, and passes the command to the communication control means 6.

The communication control means 6 performs a procedure for transmitting the command to the network 8 in association with the network interface means 7 to complete the transmission of the command to another apparatus connected to the network.

As described above, the apparatus communication control means 5 has a management function for the apparatus object 2 mounted on the apparatus 1. Thus, processing functions realized by control means such as a microcomputer held by the apparatus 1 are reduced and the communication adapter apparatus 3 is added without imposing a burden on microcomputer resources, whereby it is possible to obtain an apparatus that is remotely operable from the network. In addition, since the apparatus communication managing means 5 defines means for connection with the communication control means 6 in a predetermined format and a predetermined procedure. Thus, for example, even when a change or the like occurs in a communication protocol, there is also an advantage that a communication adapter apparatus with high universality capable of changing a protocol easily is obtained by creating a communication control unit according to a defined interface.

Second Embodiment

Figure 2:
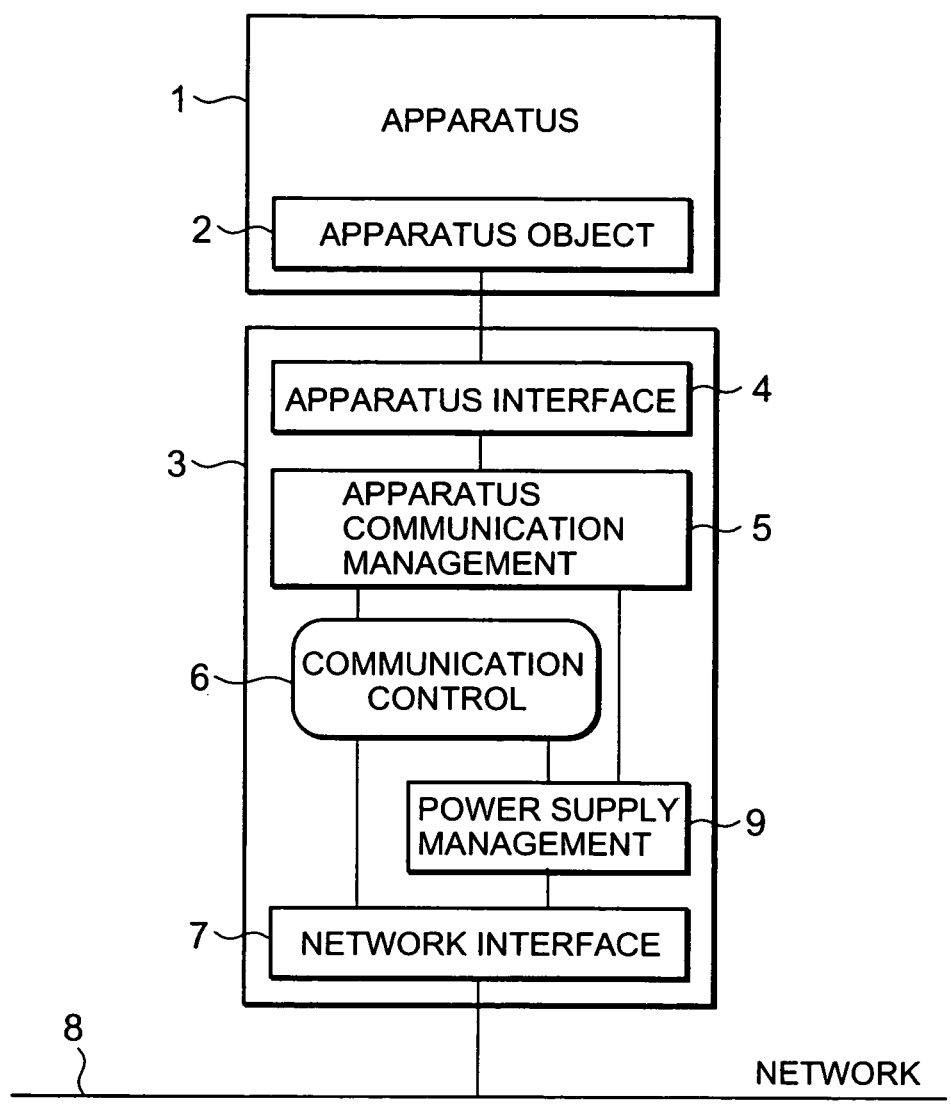
FIG. 2 is a block diagram of a communication adapter apparatus according to a second embodiment of the invention.

FIG. 2 is a block diagram showing an internal structure of a communication adapter apparatus according to a second embodiment of the invention. Components identical with or equivalent to those in FIG. 1 are denoted by the same reference numerals, and different components will be explained. In the figure, power supply managing means 9 has a function of managing a state of a power supply in the communication adapter apparatus 3, for example, a usable residual amount of power. The power supply managing means 9 acts to apply predetermined limitations to the communication control means 6 and the network interface means 7 according to a state of the management.

Next, an operation of the communication adapter apparatus will be explained.

Since an operation according to reception of an operation command and a notification system for a change in information are the same as those in the first embodiment, explanations of the operation and the notification system are omitted. An operation for power supply management will be mainly explained.

When the power supply managing means 9 has detected that, for example, a residual amount of power, which can be used in the communication adapter apparatus is only a little, the power managing means 9 instructs the network interface means 7 to shift to a mode for controlling power consumption of the network interface means 7 itself, for example, a standby mode. The power supply managing means 9 instructs the communication control means 6 to control communication frequency and notifies the communication control means 6 that the network interface means 7 has changed to the standby mode. Moreover, the power managing means 9 also gives information such as a residual amount of power to the apparatus communication managing means 5 according to a predetermined procedure.

When another apparatus connected to the network in this state transmits an operation command to the apparatus 1, the communication adapter apparatus 3 of which is connected to the network 8, the network interface means 7 detects the operation command on the network 8 according to a signal change or the like on the network 8. The network interface means 7 returns to a normal reception operation state from the standby mode to receive the operation command and pass the operation command to the communication control means 6. After performing various procedures concerning reception in association with the network interface 7, the communication control means 6 converts the acquired operation command into a predetermined format for passing the operation command to the apparatus communication managing means 5. Then, the communication control means 6 performs a predetermined procedure to pass the operation command to the apparatus communication managing means 5. After passing the command to the apparatus communication managing means 5, the network interface means 7 shifts to the standby mode. The apparatus communication managing means 5 analyzes the operation command and changes setting for the control items of the apparatus object 2 in the apparatus 1 using the apparatus interface means 4 in order to set a control item of the apparatus object 2 corresponding to the operation command.

The apparatus 1 detects that the setting for the control item of the apparatus object 2 has been changed and, after carrying out operation corresponding to the control item, changes an information item changed by the operation. Here, a series of operation according to the operation command is completed.

Next, an operation in notifying another apparatus connected to the network that the information item of the apparatus object 2 of the apparatus 1 has been changed will be explained.

The apparatus communication managing means 5 periodically monitors information items of the apparatus object 2 using the apparatus interface means 4. The apparatus communication managing means 5 limits accesses to the apparatus object 2 by, for example, extending a time interval for monitoring the information item according to power supply information obtained from the power supply managing means 9 and controls frequency of occurrence of events in the communication adapter apparatus 3. When the apparatus communication managing means detects a change in the information items, the apparatus communication managing means generates a command notifying the change in the information items, creates the command in a predetermined format, executes a predetermined processing in association with the communication control means 6, and passes the command to the communication control means 6.

After returning the network interface means 7 to the usual operation mode, the communication control means 6 performs a procedure for transmitting the command to the network 8 in association with the network interface means 7 to complete the transmission of the command to another apparatus connected to the network. After the completion of transmission, the network interface means 7 shifts to the standby mode again.

Note that, when the communication control means 6 passes a command to the network interface means 7 and causes the network interface means 7 to transmit the command, the communication control means 6 may take measures for further limitation of power consumption by, for example, delaying communication speed according to a content of detection by the power supply managing means 9.

As described above, the communication adapter apparatus 3 includes the power supply managing means 9 and reduces power consumption in the communication adapter apparatus 3 according to a management state. Thus, for example, when there is limitation on a power supply, for example, in the case of an apparatus that is required to be battery driven such as a sensor apparatus or when power is supplied from the apparatus 1, it is possible to secure operation within the limitation. Consequently, it is possible to obtain a communication adapter apparatus with which advantages such as control of an increase in cost of power supply to an apparatus and extension of a battery life are realized.

Third Embodiment

Figure 3:
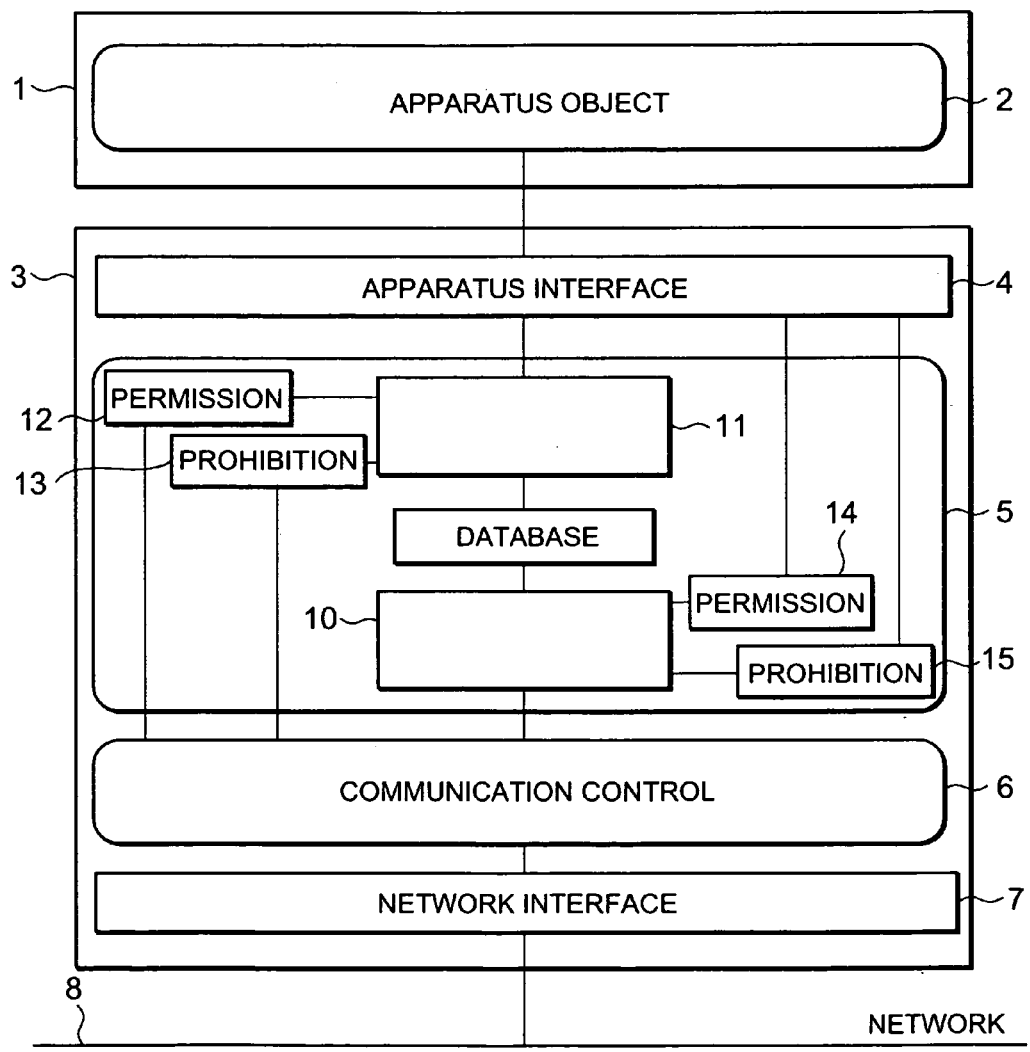
FIG. 3 is a block diagram of a communication adapter apparatus according to a third embodiment of the invention.

FIG. 3 is a block diagram of the communication adapter apparatus 3, which has a detailed internal structure of the apparatus communication managing means 5, according to a third embodiment of the invention. Components identical with or equivalent to those in FIGS. 1 and 2 are denoted by the same reference numerals, and different components will be explained. In the figure, an apparatus control access unit 10 is constituted to interface with the communication control means 6 provided in the apparatus communication managing means 5 according to a predetermined format and a predetermined procedure. In addition, permitting means 14 and prohibiting means 15 are provided such that the apparatus control access unit can be permitted or prohibited from the apparatus interface means 4.

An apparatus interface access unit 11 is constituted to interface with the apparatus interface means 4 provided in the apparatus communication managing means 5 according to a predetermined format and a predetermined procedure. In addition, permitting means 12 and prohibiting means 13 are provided such that the apparatus interface access unit 11 is permitted or prohibited from the communication control means 6.

Next, an operation of the communication adapter apparatus 3 will be explained.

When the apparatus 1 cannot receive operation from a network in a state in which the apparatus 1 is being initialized or when it is dangerous if the apparatus 1 is operated remotely from the network during maintenance or the like, the apparatus object 2 operates the prohibiting means 15 to be effective for the apparatus control access unit 10 via the apparatus interface 4 and prohibits an access to the apparatus control access unit 10 from the communication control means 6. By prohibiting the access, it is possible to control careless operation of the apparatus object 2 from the network 8. When the initialization, the maintenance, or the like ends to permit operation of the apparatus object 2, the apparatus object 2 operates the permitting means 14 to be effective for the apparatus control access unit 10 via the apparatus interface means 4 and permits an access to the apparatus control access unit 10 from the communication control means 6. Note that the permitting means 14 and the prohibiting means 15 are controlled exclusively. When one is effective, the other is made ineffective.

Next, a case in which an access from the apparatus object 2 to the apparatus communication managing means 5 is limited will be explained. When communication setting for the communication adapter apparatus 3 has not been completed, careless issuance of a command to the network and operation of the apparatus object 2 according to reception of a command should be prohibited in order to prevent malfunction of a system and danger for the system.

In such a case, the communication control means 6 operates the prohibiting means 13 to be effective for the apparatus interface access unit 11 and prohibits an access to the apparatus interface access unit 11. By prohibiting the access, since a command received by the communicating means 6 by mistake during the setting does not reach the apparatus interface means 4, it is impossible to operate the apparatus object 2. In addition, since the apparatus object 2 cannot access the apparatus communication managing means, transmission and reception of data to and from the communication control means 6 is interrupted. Note that permission of the access can be realized by operating the permitting means 12 to be effective.

In the above explanation, the communication adapter apparatus 3 is used for control of illegal accesses. However, it is also possible to use the communication adapter apparatus 3 for applications for, for example, prohibiting an access to the apparatus control access unit 10 to prohibit multiple accesses from the communicating means 6 when the apparatus communication managing means 5 is initialized or changed from the apparatus object 2 via the apparatus interface means 4 or, conversely, prohibiting an access to the apparatus interface access unit 11 when the apparatus communication managing means is initialized or changed from the communication control means 6 to initialize or change the apparatus communication managing means 5 safely.

As described above, the apparatus control access unit and the apparatus interface access unit 11 are provided in the apparatus communication managing means 5 of the communication adapter apparatus 3 and it is made possible to set permission and prohibition of accesses to the apparatus control access unit 10 and the apparatus interface access unit 11, respectively. Thus, at the time of initialization and maintenance for the apparatus 1 and the communication adapter apparatus 3, it is possible to obtain the communication adapter apparatus 3 in which work for the setting and the maintenance can be performed safely and surely.

Fourth Embodiment

Figure 4:
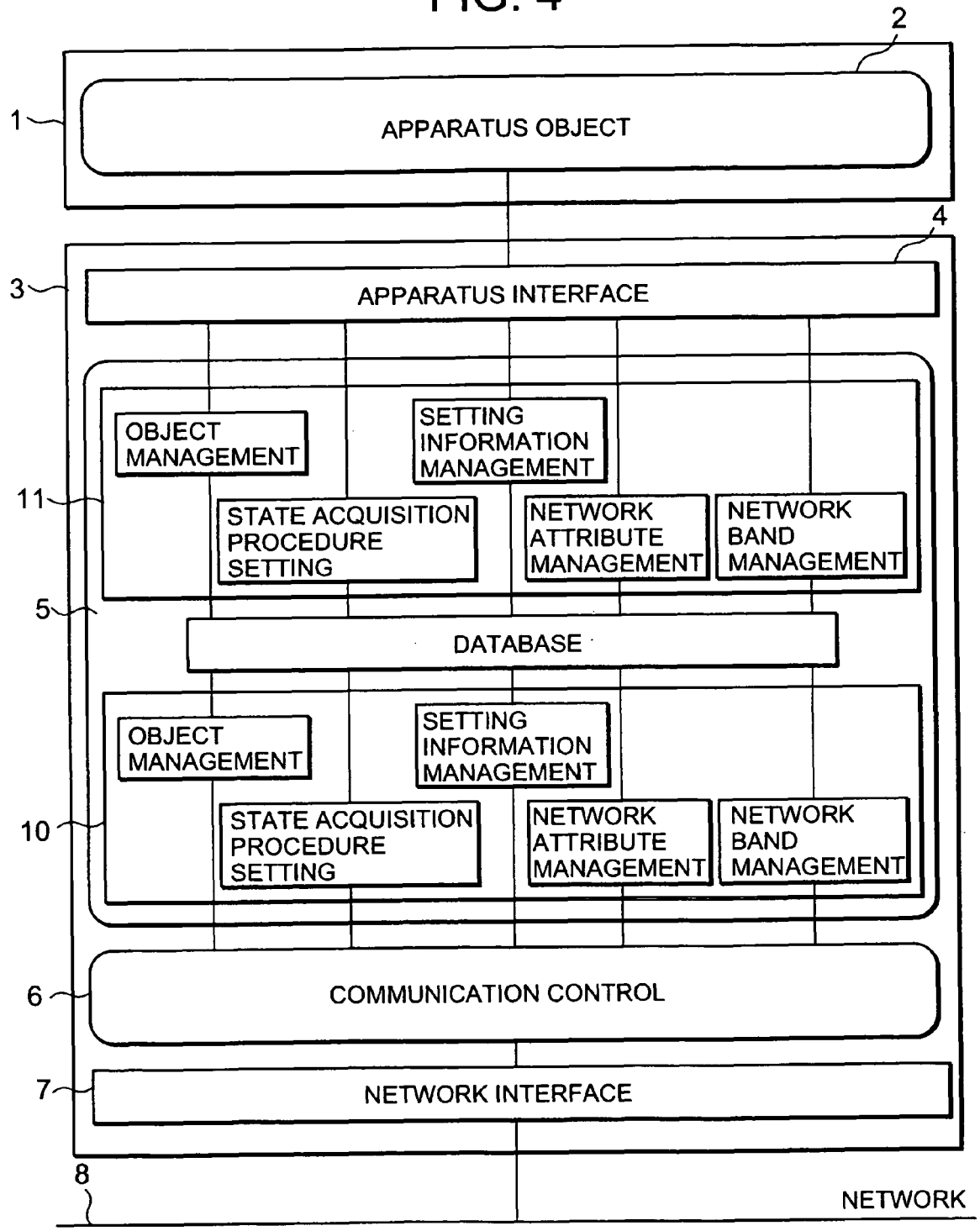
FIG. 4 is a block diagram of a communication adapter apparatus according to a fourth embodiment of the invention.

FIG. 4 is a block diagram showing functions of the apparatus communication managing means according to the first or the second embodiment of the invention in detail. Components identical with or equivalent to those in FIGS. 1 to 3 are denoted by the same reference numerals, and different components will be explained. In the figure, specific items inside the apparatus control access unit 10 and the apparatus interface access unit 11 are shown.

The apparatus control access unit 10 includes an object managing unit that performs management such as generation, deletion, and addition of instances and classes of the apparatus object 2 that are defined on the basis of definitions set between the apparatus control access unit 10 and the communication control means 6, state acquisition procedure setting means for setting a method of acquiring a state of the apparatus object 2 of the apparatus 1, installation information managing means for managing, for example, information on locations where the apparatus 1 and the communication adapter apparatus 3 are set, network attribute managing means that manages attributes of a network such as a type of the network, and network band managing means that manages a communication band (a communication capacity) and the like of the network.

The apparatus interface access unit 11 also includes means with the identical function that is defined on the basis of the apparatus interface 4 as in the apparatus control access unit 10.

Figure 9:
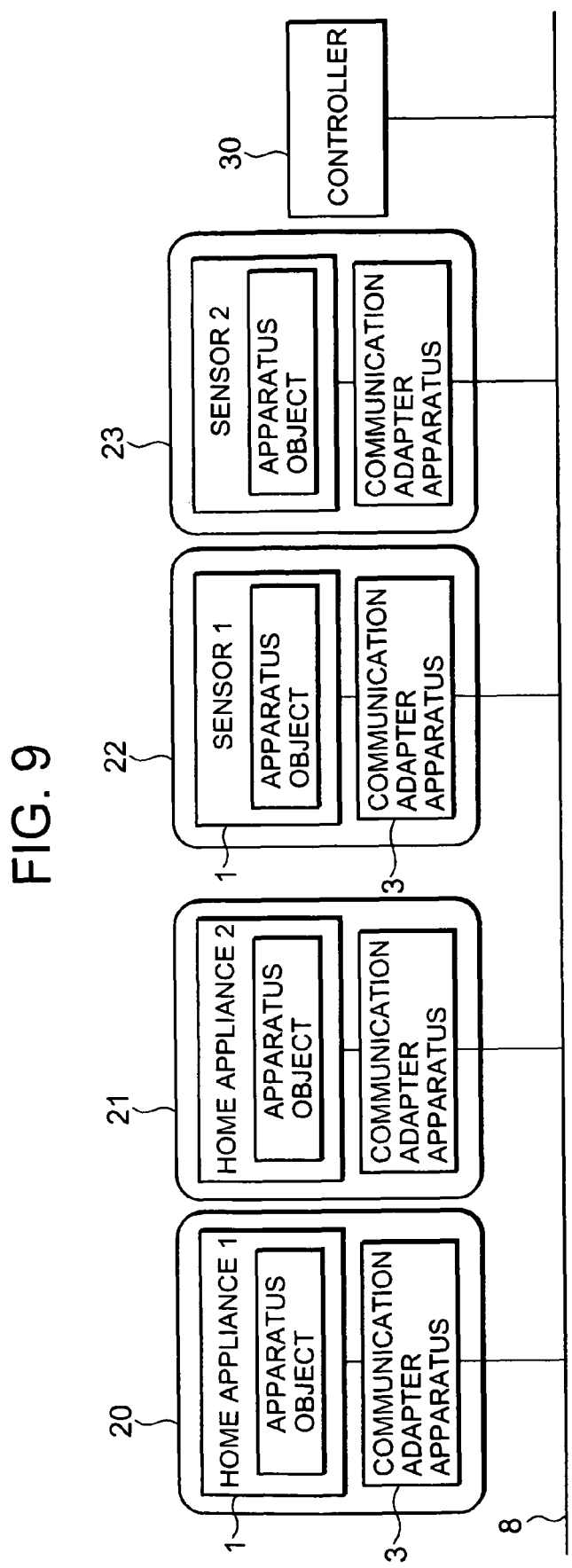
FIG. 9 is a diagram showing a structure of a system including a controller according to the fourth embodiment of the invention.

FIG. 9 shows an example of a structure of a system in which a communication node 20 or 21 including the communication apparatus 3 and the apparatus 1 according to the invention, a network sensor 22 or 23 including a sensor apparatus and the communication adapter apparatus 3, and a controller 30 are connected with the network 8 as a network.

The operations of the various means explained above in the initial setting will be hereinafter explained on the basis of this system diagram.

When the communication adapter apparatus 3 is connected with the apparatus 1, the communication adapter apparatus 3 is required to disclose, for example, various kinds of information as a communication node for the controller 30.

To acquire information of the apparatus object 2 in the apparatus 1, the apparatus communication managing means 5 uses the object managing means of the apparatus interface access unit 11 to sequentially acquire the information of the apparatus object 2 via the apparatus interface means 4. When the initialization is completed and the apparatus 1 is started, an instance change (start) in the apparatus object 2 is detected. Thus, in order to notify the network 8 of the instance change, the apparatus communication managing means 5 uses the object managing means of the apparatus control access unit 10 to transmit an instance change notification command to the communication control means 6. The communication control means 6 having received the command transmits the command to the network 8 in association with the network interface means 7. The controller 30 receives this command and detects that the apparatus 1 is started. Next, the controller 30 sets acquiring means for various states of the apparatus object 2. A method of acquiring the states can be realized by various methods such as receiving notification when an event has occurred in the apparatus 1, periodically notifying a state that the communication adapter apparatus 3 acquires by accessing the apparatus 1, or issuing a monitor command when the controller 30 needs the command and acquiring a state from a response from the controller 30.

Then, the controller 30 determines an acquisition method from the methods explained above, generates a setting command, and transmits the setting command to the network. The network interface means 7 of the communication adapter apparatus 3 receives the command and passes the command to the communication control means 6. The communication control means 6 uses the state acquisition procedure setting means provided in the apparatus control access unit 10 in the apparatus communication managing means 5 according to a predetermined procedure and sets the acquisition method instructed by the controller 30 in the apparatus communication managing means 5. The apparatus communication managing means 5 uses the state acquisition procedure setting means of the apparatus interface access unit 11 to communicate the same setting contents to the apparatus object 2 via the apparatus interface means 4. Here, the apparatus communication managing means 5 communicates the setting contents to the apparatus object 2 such that inconsistency is not caused between the apparatus object 2 and the communication adapter apparatus 3.

Next, setting for installation information of the apparatus 1 is performed. Various methods are possible for the setting of the installation information. Here, a method of giving the installation information from the controller 30 will be explained.

When an installation position of the apparatus 1 is inputted from a user or the like, the controller 30 generates a setting command for the position and transmits the setting command to the network. The network interface means 7 of the communication adapter apparatus 3 receives the command and passes the command to the communication control means 6. The communication control means 6 uses the installation information managing means provided in the apparatus control access unit 10 in the apparatus communication managing means 5 according to a predetermined procedure and sets the installation information instructed by the controller 30 in the apparatus communication managing means 5. In addition, the apparatus communication managing means 5 is also capable of using the installation position managing means of the apparatus interface access unit 11 to communicate the same setting contents to the apparatus object 2 via the apparatus interface means 4 as required.

When the installation position information is inputted from the apparatus 1, it is possible to provide the controller 30 with the installation information of the apparatus through a route opposite to the route described above.

Next, a method of notifying the controller 30 and the apparatus 1 of network attributes held by the communication adapter apparatus 3 will be explained.

The controller 30 and the communication adapter 3 are required to share items related to the network interface means 7 such as network attributes (a type and a physical address of a network) in order to identify an individual and correct a difference of a response time or the like due to a medium in respective control programs. The apparatus communication managing means 5 can acquire this information from the communication control means 6 and the network interface means 7 using the network attribute managing means of the apparatus control access unit 10. To notify the controller 30 of this information, the apparatus communication managing means 5 uses the network attribute managing means of the apparatus control access unit to pass attribute information to the communication control means 6. The communication control means 6 issues a command corresponding to the attribute information to the network interface means 7 and transmits the command to the network 8. The controller 30 receives this command and acquires information on a network attribute. In addition, on the basis of this information, the apparatus communication managing means 5 sets an interval or the like for accessing the apparatus object 2 through the apparatus interface mans 4.

Next, a method of setting a network band will be explained.

Concerning the network band, there are various objects and methods of setting such as setting of a band that is required in a system, notification of a setting value defined from limitation of the communication adapter apparatus 3, and setting of a band required by the apparatus 1.

In order to cope with the various methods and objects, the network band managing means provides the network band managing unit provided in the apparatus control access unit 10 as a route from the communication control means 6 side, that is, the controller 30 or the like through the network. In addition, the network band managing means also provides a network band managing unit in the apparatus interface access unit 11 such that setting can be performed in response to a request from the apparatus 1 side. By providing these means, it is possible to cope with the setting through the network, the limitation in the communication control means 6 and the network interface means 7, and the setting from the apparatus 1. A method of setting from these units to the apparatus communication managing means 5 can be performed in the same manner as the method for the attribute or the like. In addition, a method of access for using these setting values in the respective units is the same as the method for the network attribute, an explanation of the method is omitted.

As described above, since the object managing means, the state acquisition procedure setting means, the installation information managing means, the network attribute managing means, are the network band managing means provided and constituted to be accessible freely, it is possible to share information with a controller in system setting and the like. In addition, since the apparatus communication managing means 5 in the communication adapter apparatus 3 manages the information, it is possible to obtain the communication adapter apparatus 3 that allows an apparatus to be used as a node applicable to a network without imposing a burden on the apparatus 1.

Fifth Embodiment

Figure 5:
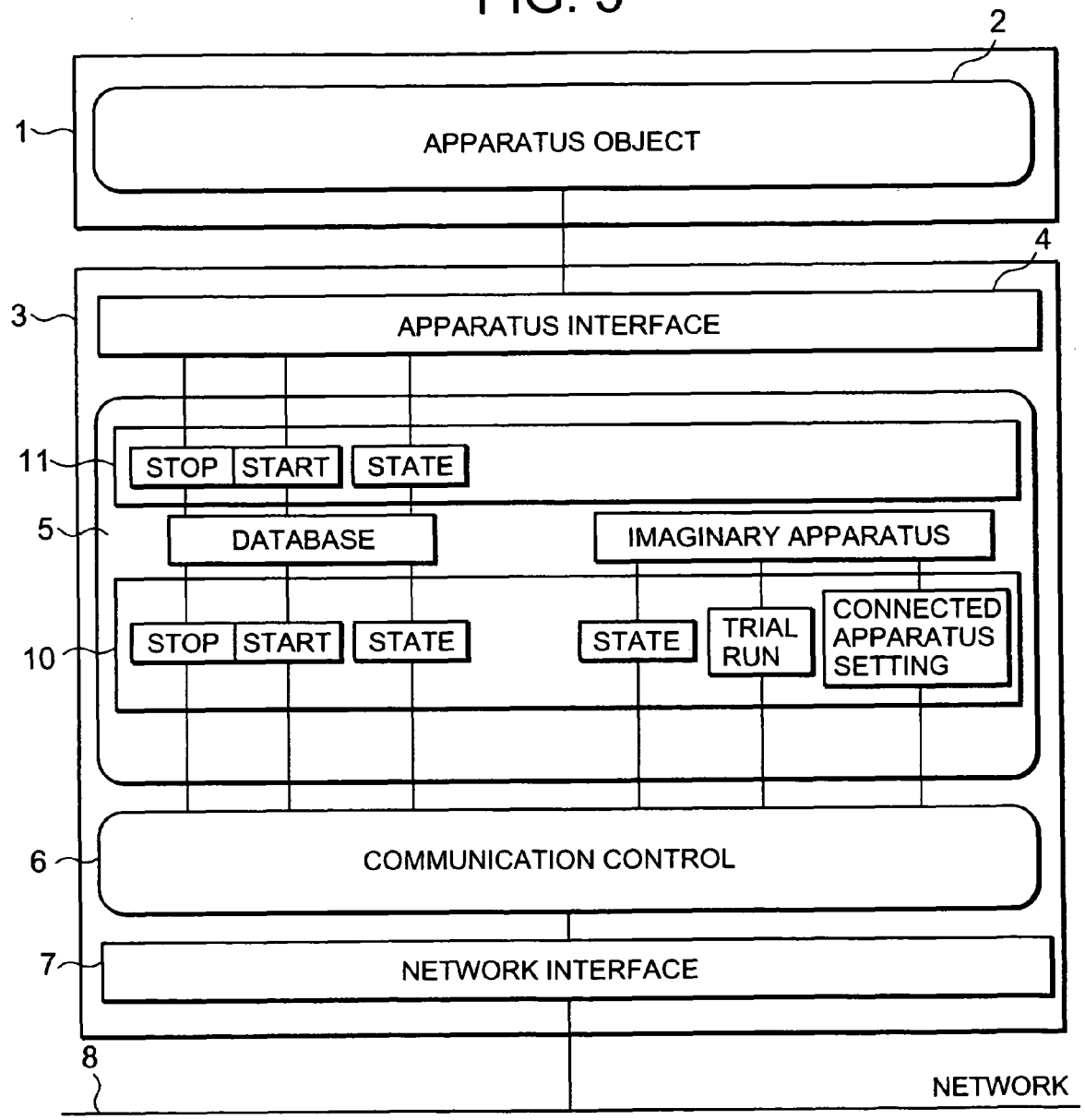
FIG. 5 is a block diagram of a communication adapter apparatus according to a fifth embodiment of the invention.

FIG. 5 is a block diagram showing the function of the apparatus communication managing means according to the first or the second embodiments of the invention in detail. FIG. 5 mainly explains a function that is used at the time of installation adjustment or the like.

The apparatus control access unit 10 and the apparatus interface access unit 11 include means for setting start and stop of operation of the apparatus object 2 managed by the apparatus communication managing means 5 and acquiring states of operation and stop of the apparatus object 2, means for setting operation and stop and acquiring states of operation and stop of the communication control unit 6 from the apparatus interface access unit 11, and means for imaginarily setting operation for the apparatus object 2 managed by the apparatus communication managing means 5 and means for imaginarily setting an apparatus.

Next, an operation of the apparatus communication managing means 5 will be explained.

The operation will be explained on the basis of a procedure for setting and test run of a system only with the communication adapter apparatus when the apparatus 1 is in an unconnected state.

The controller 30 shown in FIG. 9 transmits a setting command for a connected apparatus to the communication adapter apparatus 3. This command is transmitted through the network interface means 7, interpreted by the communication control means 6, and gives information to connected apparatus setting means of the apparatus control access unit 10. An imaginary apparatus is generated in the apparatus communication managing means 5 on the basis of this information. Thereafter, the controller 30 is capable of performing trial run and setting for the system using means provided in the apparatus control access unit 10 for imaginarily operating and setting the imaginary apparatus generated in the communication adapter apparatus 3.

When verification or the like of the system is carried out, an operation for removing a specific apparatus object from the system intentionally and reconnecting the apparatus object may be necessary. For such an application, the apparatus communication managing means 5 includes means that can set start and stop of operation of the apparatus object 2 managed by the apparatus communication managing means 5 and acquisition of states of the start and stop of operation of the apparatus object 2. In stopping the apparatus object 2, the communication adapter apparatus 3 accesses stopping means provided in the apparatus control access unit of the apparatus communication managing means 5 according to a predetermined procedure and instructs the apparatus communication managing means to stop the apparatus object 2. The apparatus communication managing means 5 stops the apparatus object 2 via the apparatus interface 4 using the stopping means of the apparatus interface access u nit 11. Conversely, to start operation of the apparatus object 2, it is possible to bring the apparatus object 2 into an operation state according to the same method using starting means instead of the stopping means.

As described above, the communication adapter apparatus 3 is constituted be capable of controlling start and stop of the apparatus object 2 freely and performing verification of an action by the imaginary apparatus by itself. Thus, it is possible to obtain a communication adapter apparatus that can easily carry out system setting in the case in which an apparatus is not in an operation state at the time of execution of works and can efficiently perform verification work at the time of system development.

Sixth Embodiment

Figure 6:
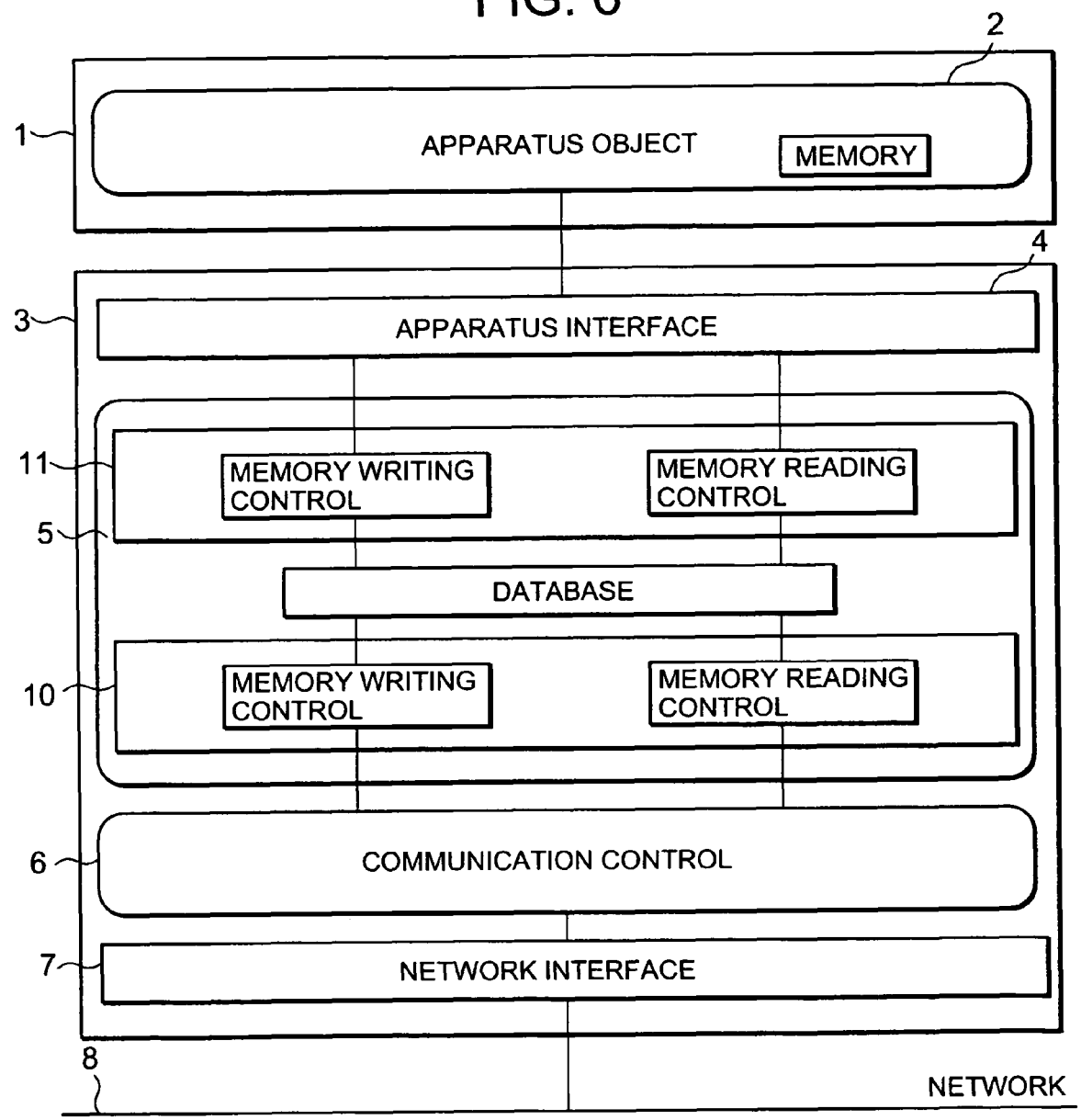
FIG. 6 is a block diagram of a communication adapter apparatus according to a sixth embodiment of the invention.

FIG. 6 is a block diagram showing a function of the apparatus communication managing means 5 according to the first or the second embodiment of the invention in detail. FIG. 6 mainly shows a function for promoting convenience in replacement or the like of the communication adapter apparatus 3.

Memory writing control means and memory reading control means are set in the apparatus control access unit 10 and the apparatus interface access unit 11 in the apparatus communication managing means 5 as means for accessing a nonvolatile memory provided in the apparatus object 2 in the apparatus 1.

An operation of the apparatus communication managing means 5 will be hereinafter explained.

The communication adapter apparatus 3 holds information such as addresses required in network communication and the various setting values described in the third embodiment. The communication adapter apparatus 3 constitutes a communication node together with the apparatus 1.

When the communication adapter apparatus breaks down because of some cause, replacement work for the communication adapter apparatus 3 is required. The communication adapter apparatus 3 of the invention stores the setting contents described above in a memory of the apparatus object 2 according to the following procedure.

The apparatus communication managing means 5 holds all pieces of setting information. When setting is completed, the apparatus communication managing means 5 causes the memory writing control means of the apparatus interface access unit 11 to store the setting information in the memory in the apparatus object 2 through the apparatus interface 4.

Next, when the communication adapter apparatus 3 is replaced, the apparatus communication managing means 5 uses the memory reading control means of the apparatus interface access unit 11 to access the memory in the apparatus object 2 and acquire the setting information. The apparatus communication managing means 5 holds the acquired setting contents in the database 5 and provides necessary information to the communication control means 6 and the network interface means 7. As a method of providing of the information, the apparatus communication managing means 5 using the memory reading control means in the apparatus control access unit 10 to notify the network interface means 7 through the communication control means 6. In this way, it is possible to restore the setting values only in the communication adapter apparatus 3.

In order to store information that is not managed by the apparatus communication managing means 5 such as information in the communication control means in the apparatus object 2, the information is written in the apparatus object 2 through the apparatus communication managing means 5 using the memory writing control means in the apparatus control access unit 10.

As described above, since it is possible to temporarily store the information in the communication adapter apparatus 3 in the apparatus object in the apparatus 1, it is unnecessary to perform resetting and the like of a system that are required conventionally in replacement of the communication adapter apparatus 3 and it is possible to obtain the communication adapter apparatus 3 that can be replaced easily.

Seventh Embodiment

Figure 7:
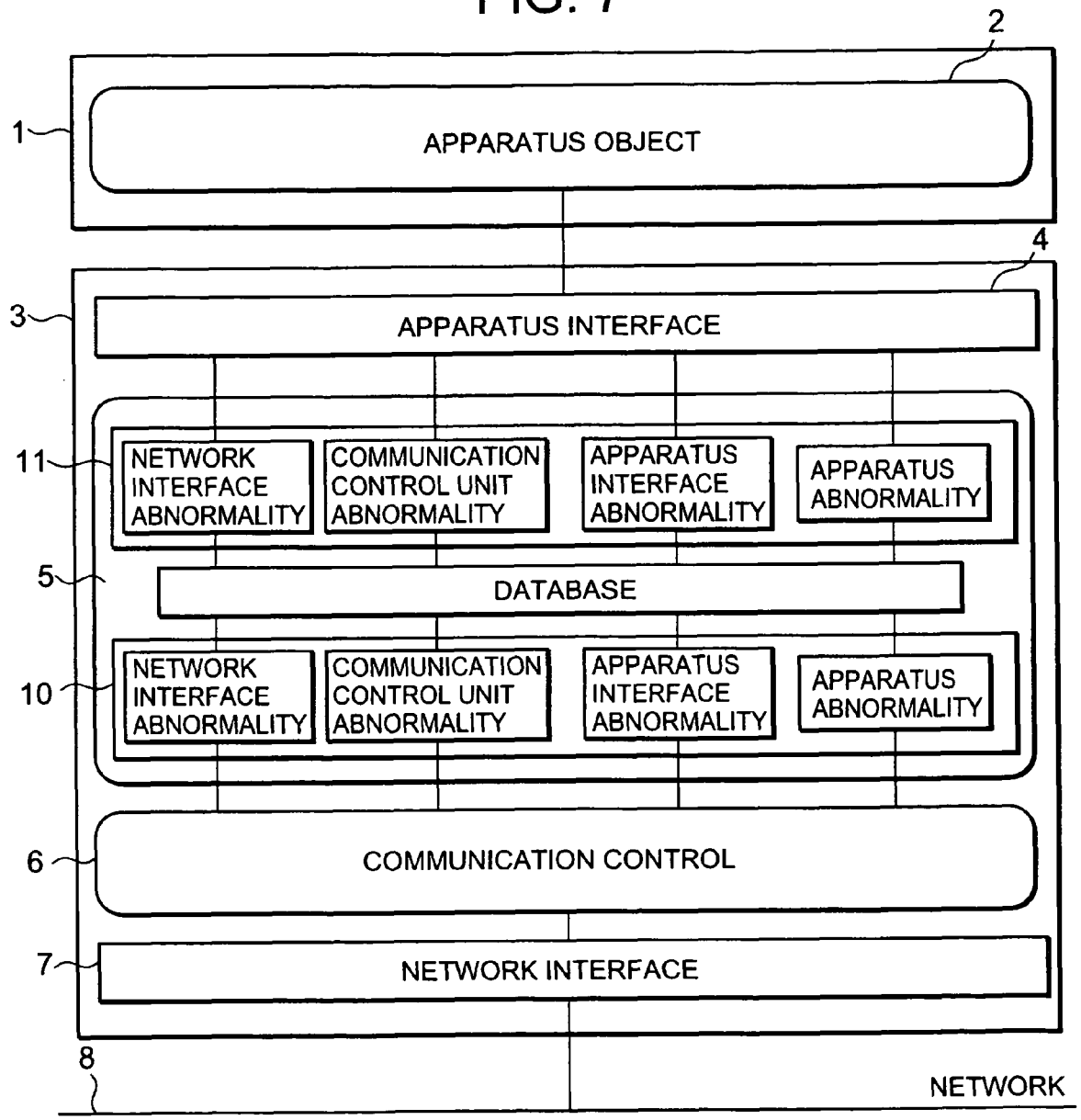
FIG. 7 is a block diagram of a communication adapter apparatus according to a seventh embodiment of the invention.

FIG. 7 is a block diagram showing a function of the apparatus communication managing means 5 according to the first or the second embodiment of the invention in detail. The apparatus communication managing means 5 mainly includes means that provides the apparatus communication managing means 5 with contents of abnormality such that it is possible to easily specify an abnormal section in various abnormal states detected by the communication adapter apparatus 3.

The apparatus communication managing means 5 includes network interface abnormality means that provides abnormality concerning the network 8, communication control abnormality means for providing abnormality of the communication control means 6, apparatus interface abnormality means for providing abnormality concerning the apparatus interface means 4, and apparatus abnormality means for providing abnormality of an apparatus.

Next, an operation of the apparatus communication managing means 5 will be explained.

The apparatus communication managing means 5 collects information on abnormality detected in the respective components consisting of the network interface means 7, the communication control means 6, the apparatus interface 4, and the apparatus 1 (the apparatus object 2) through the apparatus control access unit 10 and the apparatus interface access unit 11 and manages the information unitarily while sequentially updating the information. For example, when the controller 30 checks abnormality, which occurs in the apparatus 1 of the communication node 20 shown in FIG. 9, through the network, the controller 30 issues a command for accessing the apparatus abnormality means in the apparatus communication managing means 5. As a result, an acquisition command for apparatus abnormality is executed via the network interface means 7 and the communication control means 6 and data of apparatus abnormality managed by the apparatus communication managing means 5 is provided to the controller 30 through the communication control means 6, the network interface means 7, and the network 8. It is also possible to acquire information on abnormality of the apparatus interface means 4 in the same procedure by changing an access destination to the apparatus interface abnormality means.

Concerning abnormality related to the network 8, since it may be impossible to provide information through the network, in this explanation, it is assumed that a display function is provided in the apparatus object 2. The apparatus object 2 uses the apparatus interface means 4 to access the network abnormality means or the communication control abnormality means of the apparatus interface access unit 11 and acquire information on abnormality of the communication control means 6 or the network interface means 7 from the apparatus communication managing means 5. When some abnormality is detected, the apparatus object 2 carries out display or the like corresponding to contents of the abnormality.

As described above, since the apparatus communication managing means 5 has the means for classifying abnormality states, which are detectable inside the communication adapter apparatus 3, and notifying the network 8 or the apparatus 1 of the abnormality states. Thus, when deficiency of the system occurs, it is possible to easily judge whether the deficiency is caused by a failure of the apparatus, a failure of the communication adapter apparatus 3 and judge whether abnormality of the communication adapter apparatus 3 is caused by a failure of the apparatus interface means 4 or abnormality of the communication control means 6. Thus, it is possible to obtain a communication adapter apparatus that is capable of specifying a point of deficiency efficiently and restore the system promptly.

Eighth Embodiment

Figure 8:
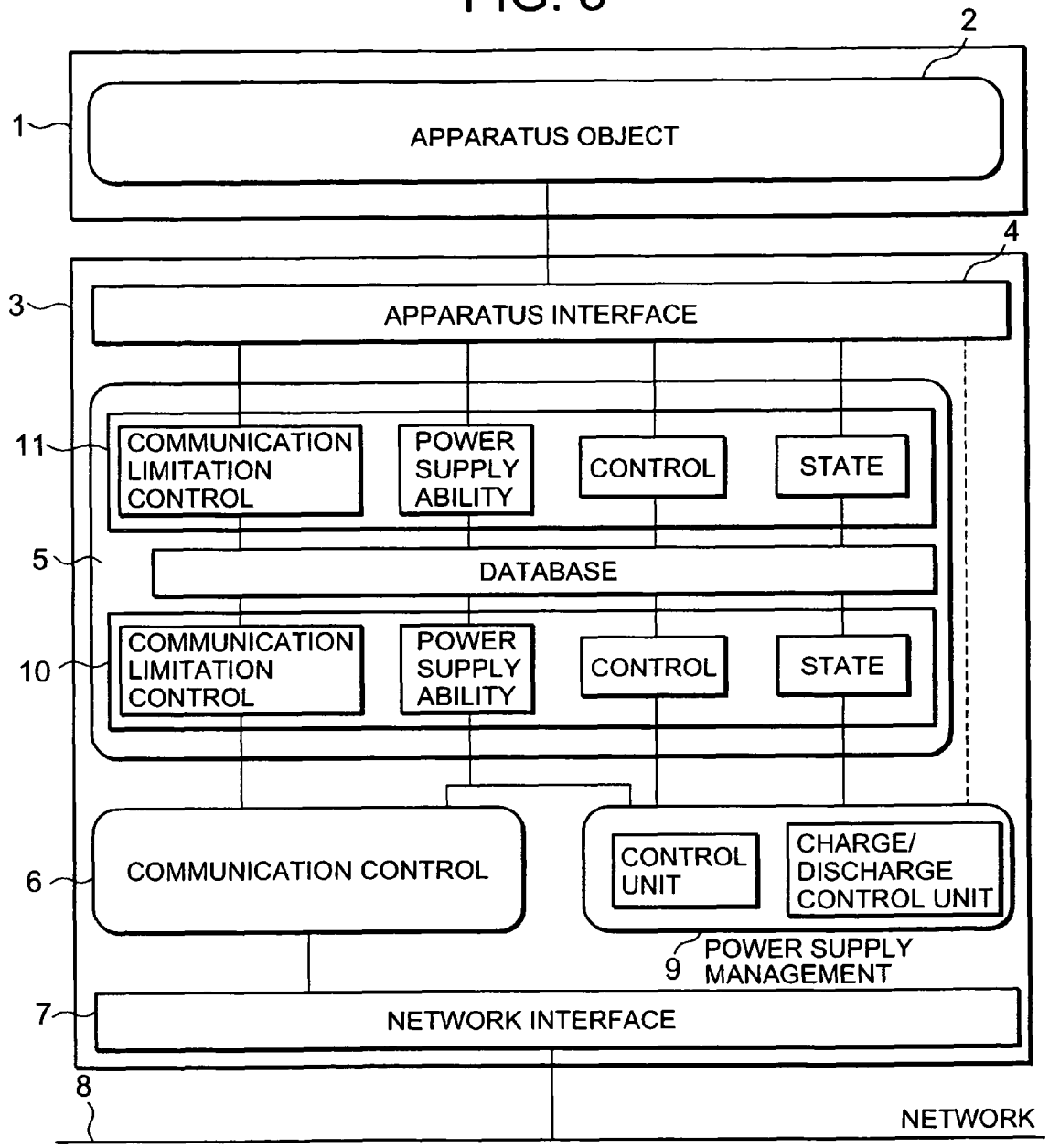
FIG. 8 is a block diagram of a communication adapter apparatus according to an eighth embodiment of the invention.

FIG. 8 is a block diagram of the communication adapter apparatus 3 that operates with power fed from the apparatus 1 through the apparatus interface means 4 according to the eighth embodiment of the invention. Components identical with or equivalent to those in FIGS. 1 to 7 are denoted by the same reference numerals.

The apparatus control access unit 10 and the apparatus interface access unit 11 include, other than means for using the apparatus object 2, state providing means that provides various states of the power supply managing means 9, power supply control means for controlling the power supply managing means 9, and power supply ability acquiring means for acquiring power supply ability or the like. In addition, the apparatus control access unit 10 and the apparatus interface access unit 11 include communication limitation control means for controlling limitation on the communication control means according to information of these means.

The network interface means 7 has a function of interface to the network 8, a function capable of limiting power consumption of the network interface means 7 itself such as functions of shifting or returning to the standby mode, changing transmission speed, and the like. (In general, it is known that network interface means consumes large power at the time of a transmission operation.) The power supply managing means 9 includes a charge/discharge control unit and a control unit and has a function of receiving supply of power from the apparatus interface means 4 and charging this power, a function of supplying power to the respective units as required, and a function of providing suppliable power capacity based on the present charged capacity.

Next, an operation of the communication adapter apparatus 3 will be explained.

At the time of build-up, the communication adapter apparatus 3 accesses the apparatus object 2 of the apparatus 1 using the power supply ability acquiring means of the apparatus interface access unit 11 through the apparatus interface means 4 and acquires a capacity of power suppliable from the apparatus 1 into the apparatus communication managing means 5. In addition, the communication adapter apparatus 3 acquires and holds power supply capacity data necessary for operations of the communication control means 6 and the network interface means 7 using the power supply capacity acquiring means of the apparatus control access unit 10.

The power supply managing means 9 accesses the power supply capacity acquiring means in the apparatus control access means 10 to acquire information on the acquired power supply capacity to be supplied and a power supply capacity necessary for operations and sets duty of charge and discharge and a system for power saving control of the communication control means.

For example, when electric power necessary for an operation is 3 in a period in which suppliable electric power is 1, the power supply managing means 9 controls an operation of the communication adapter apparatus 3 within electric power to be supplied by carrying out control for, for example, allowing operations of the communication control means 6 and the network interface means 7 using the apparatus control access means for the period in which the electric power is 1 after charging the electric power of 3.

When such an intermittent operation is not allowed depending on an application, the communication control means 6 acquires a state of the charge/discharge control unit managed by the power supply managing means 9 from the apparatus communication managing means 5 via the apparatus control access unit 10. Every time an event of a transmission request for data is issued, the communication control means 6 monitors information of the power supply managing means to judge whether the charge/discharge control unit has reached a charged state in which a transmission operation is possible and controls a mode of the network interface means 7. If the charge/discharge control unit is not in the state in which transmission is possible, the apparatus communication managing means 5 is capable of providing a source of issuance of the transmission event with information, which indicates that the communication adapter apparatus 3 is on standby for transmission, through the communication limiting means. In addition, concerning a reception operation, the apparatus communication managing means 5 operates to start the reception operation by, for example, controlling the network interface means 7 to the standby mode and controlling the network interface means 7 to the normal mode according to a signal change or the like of the network 8. However, in the case of reception, it is also possible to shift the network interface means 7 to the normal mode via the communication limiting means when a charge state of the charge/discharge control unit in the power supply managing means 9 is insufficient for a reception operation.

The apparatus communication managing means 5 provides the apparatus object 2 with a power supply state of the power supply managing means using the state providing means provided in the apparatus interface access unit 11. Consequently, if the apparatus object 2 has a function of generating a transmission event spontaneously, the apparatus communication managing means 5 is also capable of limiting the function and controlling transmission power.

When the apparatus communication managing means 5 manages an access to the apparatus object 2, according to a grasped power supply state, the apparatus communication managing means 5 uses the communication limiting means of the apparatus interface access unit 11 to adjust frequency and a time interval of access to the apparatus object 2 via the apparatus interface 4. Consequently, it is possible to adjust frequency of occurrence of a transmission event according to an electric power capacity.

As described above, when only limited power is supplied from the apparatus 1, it is possible to operate the communication adapter apparatus 3 in a range of suppliable electric power using the power supply managing means 9 provided in the communication adapter apparatus 3 and the means for providing various kinds of information and the communication limitation control means provided in the apparatus communication managing means 5. Thus, when a communication adapter apparatus is added in order to connect a home appliance through the network, it is possible to obtain a communication adapter apparatus for which power supply work is unnecessary and it is possible to perform execution of works easily.

Ninth Embodiment

Figure 10:
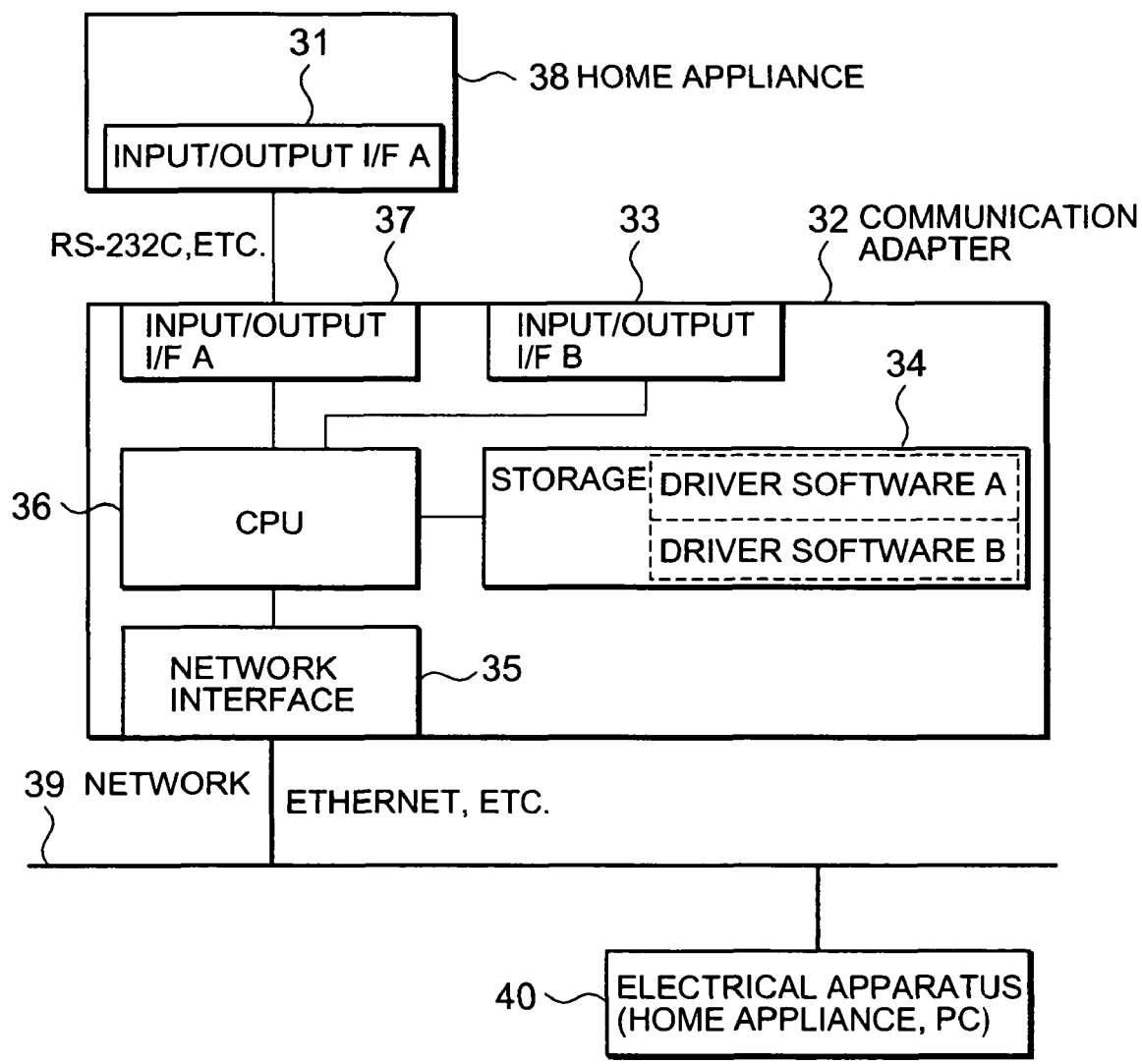
FIG. 10 is a system diagram showing a relation among a communication adapter, a home appliance, and a network according to a ninth embodiment of the invention.

FIG. 10 is a diagram of a system using a communication adapter according to a ninth embodiment of the invention.

In the figure, a connector A31 disposed in a home appliance 38. The home appliance 38 exchanges attribute information with the communication adapter 32 via the connector A31. This connector will be hereinafter referred to as an input/output interface (an input/output I/F).

The communication adapter 32 includes input/output interfaces A37 and B33 for exchanging attribute information with the home appliance 38, a network interface 35 for exchanging information with an electronic appliance 40 such as other home appliances and a personal computer via a network 39 such as Ethernet (registered trademark), a CPU 36 that exchanges information between the input/output interfaces A37 and B33 and the network interface 35 and processes this information, and a storage 34 that is applicable to input/output systems used in home appliances connected to the input/output interfaces A37 and B33 and in which driver software A and B for controlling hardware of the input/output interfaces is stored.

The input/output interfaces A and B are connectors of the same type. Formats corresponding to the input/output systems of the home appliances connected thereto are selected as formats of the input/output interfaces A and B. Here, for simplification of explanation, it is assumed that one of formats of serial input/output and contact input/output is selected.

Figure 11:
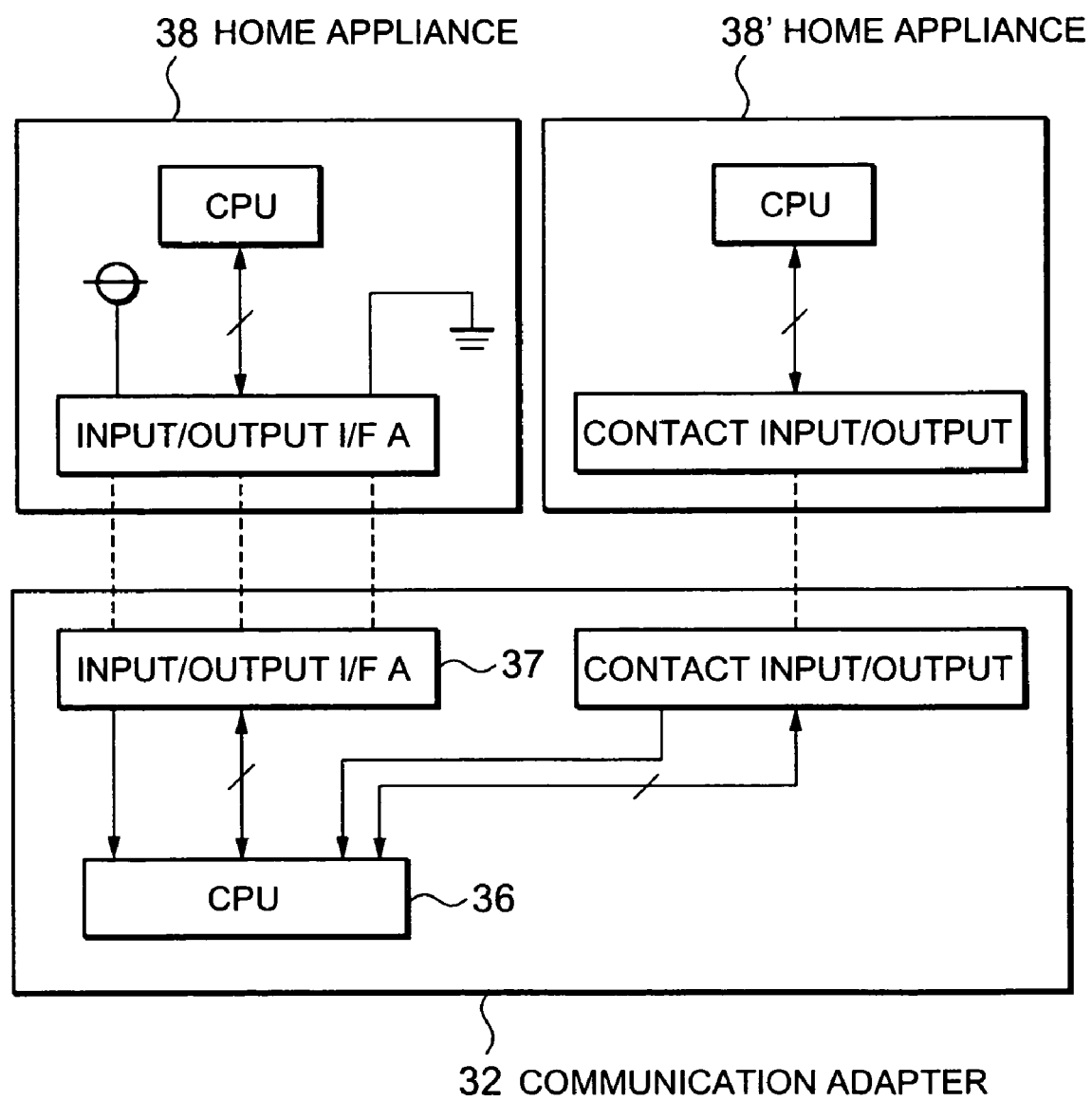
FIG. 11 is a diagram showing a state in which two home appliances with different input/output formats are connected to the communication adapter according to the ninth embodiment of the invention.

FIG. 11 shows a state in which two home appliances 38 and 38' with different input/output systems are connected to the communication adapter 32. In the figure, input/output interfaces of the home appliances 38 and 38' correspond to the serial input/output format and the contact input/output format, respectively.

A power supply for an interface is provided for the home appliance 38 including the interface of the serial input/output format. The power supply supplies a power supply voltage signal to a specific terminal of the input/output interface.

Next, an operation of the communication adapter 32 will be explained with reference to FIGS. 10 and 11.

The CPU 36 checks whether a power supply voltage signal is supplied to specific terminals of plural input/output interfaces (in FIG. 11, two input/output interfaces A37 and B33), respectively. When home appliances are connected to the input/output interfaces and a power supply voltage signal is detected from the checked specific terminals, the CPU 36 judges that an input/output format of the connected home appliance 38 is the serial input/output format and starts driver software A, which controls hardware of an interface of the serial input/output format, stored in the storage 34. According to the start of this drier software A, the communication adapter 32 communicates with the connected home appliance 38 and reads out attribute information from the home appliance 38. This attribute information is stored in the storage 34 via the CPU 36. The stored attribute information is utilized for accessing the home appliance 38 to obtain and control various kinds of information.

On the other hand, when a home appliance is connected to the input/output interfaces and a power supply voltage signal is not detected from the checked specific terminal, the CPU 36 judges that an input/output format of the connected home appliance 38' is the contact input/output format. Then, the CPU 36 causes the connected input/output interface to start the driver software B for controlling the interface hardware of the contact input/output format stored in the storage 34. According to the start of the driver software B, the communication adapter 32 communicates with the connected home appliance 38' and reads out attribute information such as an apparatus model and power consumption from the home appliance 38'. This attribute information is stored in the storage 34 via the CPU 36. The stored attribute information is utilized for accessing the home appliance 38' to obtain and control various kinds of information.

With such a structure, a format of an input/output interface corresponding to a home appliance connected to the communication adapter 32 is judged and driver software for controlling an interface hardware corresponding to the input/output interface is started.

According to the start of the driver software, attribute information concerning the connected home appliance is stored in the storage 34 via the CPU 36. In this way, it is possible to automatically set the attribute information in the communication adapter 32 without using a barcode and a barcode reader.

Note that, although the two input/output interfaces A37 and B33 are provided in the communication adapter 32 in the explanation of the figure, the same holds true for a communication adapter including two or more input/output interfaces. In addition, it is also possible to judge a format of an input/output interface according to the same method when there are input/output formats other than the serial input/output format and the contact input/output format.

Tenth Embodiment

In the explanation of the ninth embodiment, the CPU judges whether an input/output format of a connected home appliance is the serial input/output or the contact input/output and acquires attribute information of the home appliance.

In an explanation of this embodiment, only when an input/output interface of a connected home appliance is the serial input/output format, the CPU judges whether the input/output interface is a clock synchronous type or a clock asynchronous type and acquires attribute information of the home appliance.

Figure 12:
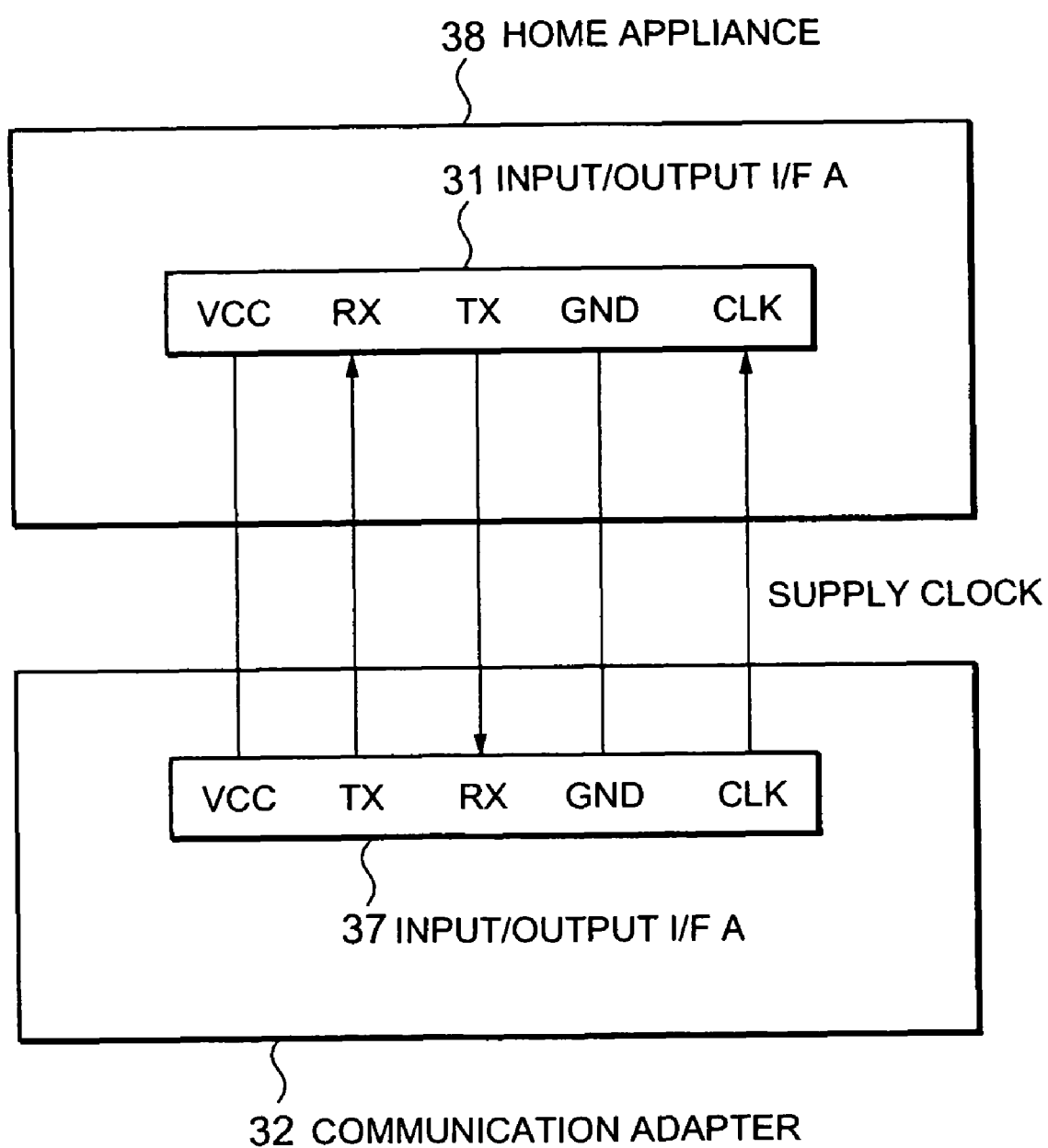
FIG. 12 is a diagram in which a home appliance with an input/output interface of a clock synchronization type is connected to a communication adapter according to a tenth embodiment of the invention.

FIG. 12 shows a state in which the home appliance 38 including a serial input/output interface of the clock synchronous type and the communication adapter 32 are connected. In the figure, VCC, TX, RX, GND, and CLK represent a power supply voltage signal terminal, a transmission signal terminal, a reception signal terminal, a ground terminal, and a clock signal terminal.

Here, in home appliances of the serial input/output format, a home appliance of the clock synchronous type cannot perform serial communication unless a clock signal is supplied from the communication adapter 32. However, a home appliance of the clock asynchronous type is capable of performing serial communication even if a clock signal is not supplied from the communication adapter 32. Therefore, as shown in FIG. 12, a specific CLK terminal for supplying a clock signal is set in an input/output interface such that a communication sequence is established even when a serial input/output interface of the clock synchronous type is connected.

Next, an operation of the communication adapter 32 will be explained.

After judging a serial input/output format of a home appliance according to the method described in the ninth embodiment, the CPU 36 starts driver software of the clock asynchronous type that can communicate with the home appliance without a clock signal and tries communication with the home appliance without supplying a clock signal to the CLK terminal.

As a result, if it is confirmed that a normal communication sequence can be realized, the CPU 36 judges that the home appliance is the clock asynchronous type and continues the communication without changing the driver software.

On the other hand, when the CPU 36 cannot communicate with the home appliance, the CPU 36 changes the driver software to the clock synchronous type on the communication adapter side, supplies a clock signal to the home appliance via the CLK terminal, and tries communication. In this way, the communication adapter 32 judges whether the serial input/output format is the clock synchronous type or the clock asynchronous type and automatically switches the clock synchronous type and the clock asynchronous type.

After the clock synchronous type and the clock asynchronous type are switched, the communication adapter 32 communicates with the home appliance 38' connected to the communication adapter 32 and reads out attribute information such as a model name and power consumption. This attribute information is stored in the storage apparatus 34 via the CPU 36. The stored attribute information is utilized for accessing the home appliance 38' to obtain and control various kinds of information. In this way, it is possible to automatically set the attribute information in the communication adapter 32 without using a barcode and a barcode reader.

Note that, although the two input/output interfaces A37 and B33 are provided in the communication adapter 32 in the explanation of the figure, the same holds true for a communication adapter including two or more input/output interfaces.

Eleventh Embodiment

In the explanation of the ninth and the tenth embodiments, the communication adapter 32 judges an input/output format or clock synchronous/clock asynchronous of a connected home appliance and, then, acquires attribute information of the home appliance.

In an explanation of this embodiment, after attribute information is acquired, it becomes necessary to change the attribute information because of extension of a system or it becomes necessary to perform monitoring and control.

In this embodiment, attribute information is changed from an electrical apparatus such as a personal computer via the network 39 without using a barcode and a barcode reader. In a connection form shown in FIG. 10, attribute information and driver software for the home appliance 38 is changed, monitored, and controlled from an electrical apparatus 40 connected to the network 39. An operation in this embodiment will be explained.

First, it will be explained how attribute information and driver software stored in the storage 34 are changed when the attribute information and the driver software are known for an electrical apparatus connected to a network.

In this case, it is sufficient to transmit a transmission frame (message), in which the attribute information and the driver software to be changed are described, to the communication adapter 32 from the electrical apparatus connected to the network.

For example, the CPU 36 having received this message ends the drive software in use immediately and reads out designated driver software out of a driver software group stored in the storage 34 and starts the driver software.

If the attribute information and the driver software stored in the storage 34 are known in this way, it is possible to change the attribute information and the driver software easily only by transmitting a message from the electrical apparatus connected to the network without using a barcode and a barcode reader.

Next, it will be explained how attribute information and driver software stored in the storage 34 are changed when the attribute information and the driver software are unknown for an electrical apparatus connected to a network.

In this case, the communication adapter 32 needs to check and disclose to the network 39 what is the home appliance 38 connected to the communication adapter 32, what kind of information the home appliance 38 can receive, and what kind of monitoring and control the home appliance 38 can perform.

Figure 13:
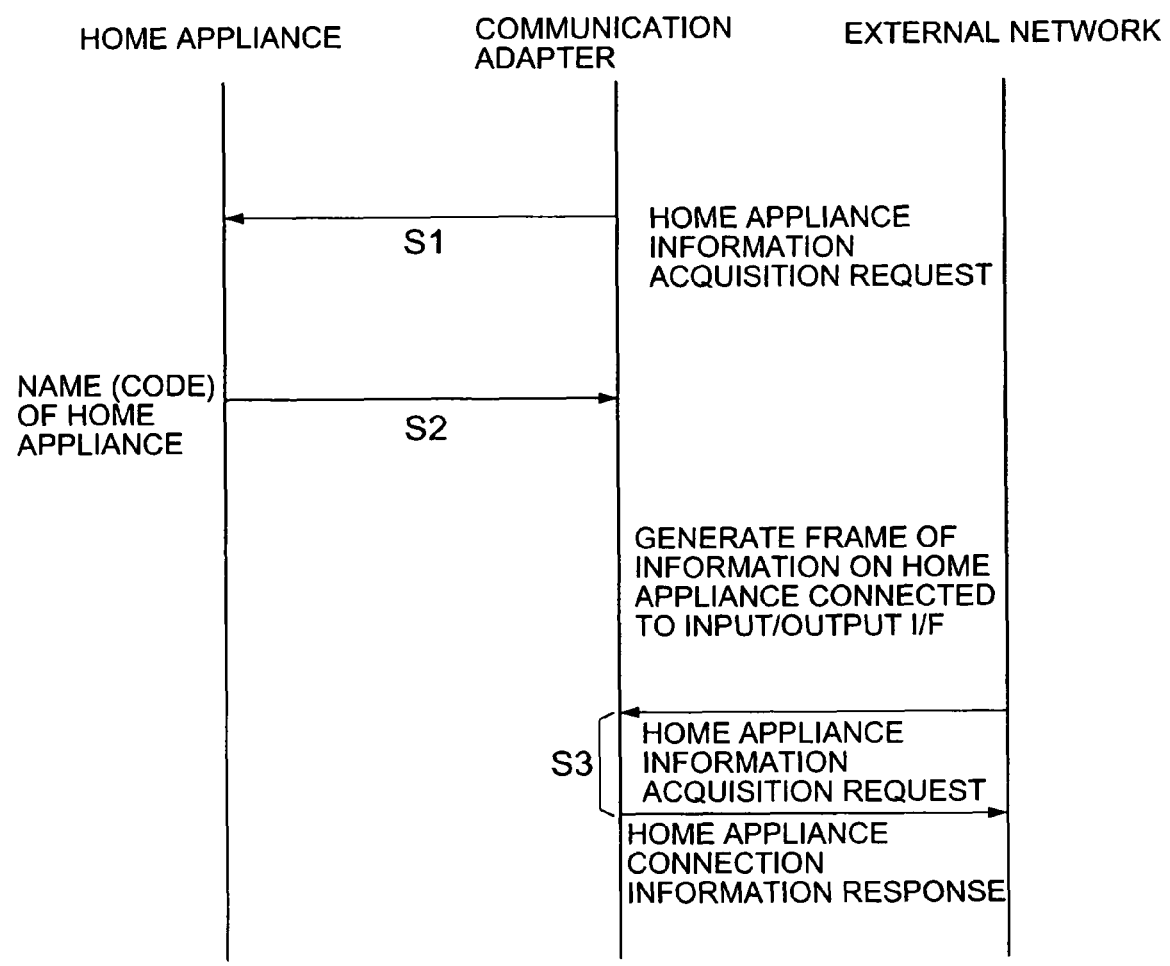
FIG. 13 is a diagram showing a procedure for referring to a home appliance connected to a communication adapter according to an eleventh embodiment of the invention from a network.

FIG. 13 shows a procedure for disclosing attribute information of the connected home appliance 38 to the network 39.

The procedure will be hereinafter explained assuming that control programs for various home appliances are stored in the storage 34 of the communication adapter 32.

First, after the home appliance 38 is connected to the communication adapter 32, the communication adapter 32 generates a request frame 1 (a home appliance information acquisition request 1), which consists of a request for acquiring information on the home appliance 38, and transmits the request frame 1 to the home appliance 38 via the input/output interface A37 and waits for a response to this request frame 1 from the home appliance 38 (step S1).

When the home appliance 38 receives the request frame 1, the home appliance 38 returns a name (a code number) of the home appliance 38 itself to the communication adapter 32. The communication adapter receives the code number returned from the home appliance (step S2), extracts a control program corresponding to the home appliance out of the control program group stored in the storage 34 and sets the control program.

Through this step, the communication adapter 32 can learn what is the home appliance 38 connected to the input/output interface A37 and set attribute information concerning the home appliance 38 and information that the communication adapter 32 can monitor and control.

Such a step is performed in parallel for all input/output interfaces of the communication adapter. The communication adapter can set attribute information concerning all home appliances connected to the communication adapter itself and information that the communication adapter can monitor and control.

Next, consideration is given to changing, monitoring, and control of attribute information of a home appliance connected to the communication adapter 32, in which information is set as described above, from the electrical apparatus 40 connected to the network 39.

In this case, first, the electrical apparatus 40 generates a request frame 2 (a home appliance information acquisition request 2) consisting of a request for acquiring information concerning a home appliance connected to a communication adapter and sends the request frame 2 to the communication adapter 32.

The communication adapter 32 generates a response frame (a home appliance attribute information response) as a response to the request frame 32 (the home appliance information acquisition request) on the basis of attribute information of all connected home appliances and information with which the home appliance can be monitored and controlled and returns the response frame to the request frame 32. According to the response frame from the communication adapter, the electrical apparatus 40 can judge what kind of home appliance 38 is connected to the network 39 and can acquire attribute information concerning the home appliance 38 and information with which the home appliance 38 can be monitored and controlled (step S3). Then, to change the attribute information on the home appliances and monitoring and control of the home appliances on the basis of the acquired information, it is sufficient to transmit a message describing contents of the change as in the above-mentioned case in which attribute information is known.

In this way, it is possible to change the attribute information on the home appliances connected to the communication adapter and monitor and control the home appliances from the electrical appliance 40 connected to the network 39 on the basis of the acquired information without using a barcode and a barcode reader.

Note that, in this explanation, a control program group for various home appliances is stored in the storage 34 of the communication adapter 32 and an electrical apparatus, to which the communication adapter is connected, is judged via input/output interfaces between the communication adapter and the home appliances. However, it is also possible to transmit a frame, which sets a home appliance connected to an input/output interface of the communication adapter, to the communication adapter 32 from an electrical apparatus such as a personal computer connected to the network 39. In this way, it is possible to set and change a control program for the pertinent home appliance and establish a response frame on the basis of the transmitted frame.

Twelfth Embodiment

An electrical apparatus will be explained with a communication adapter for connecting a home appliance to an external network as an example.

Figure 14:
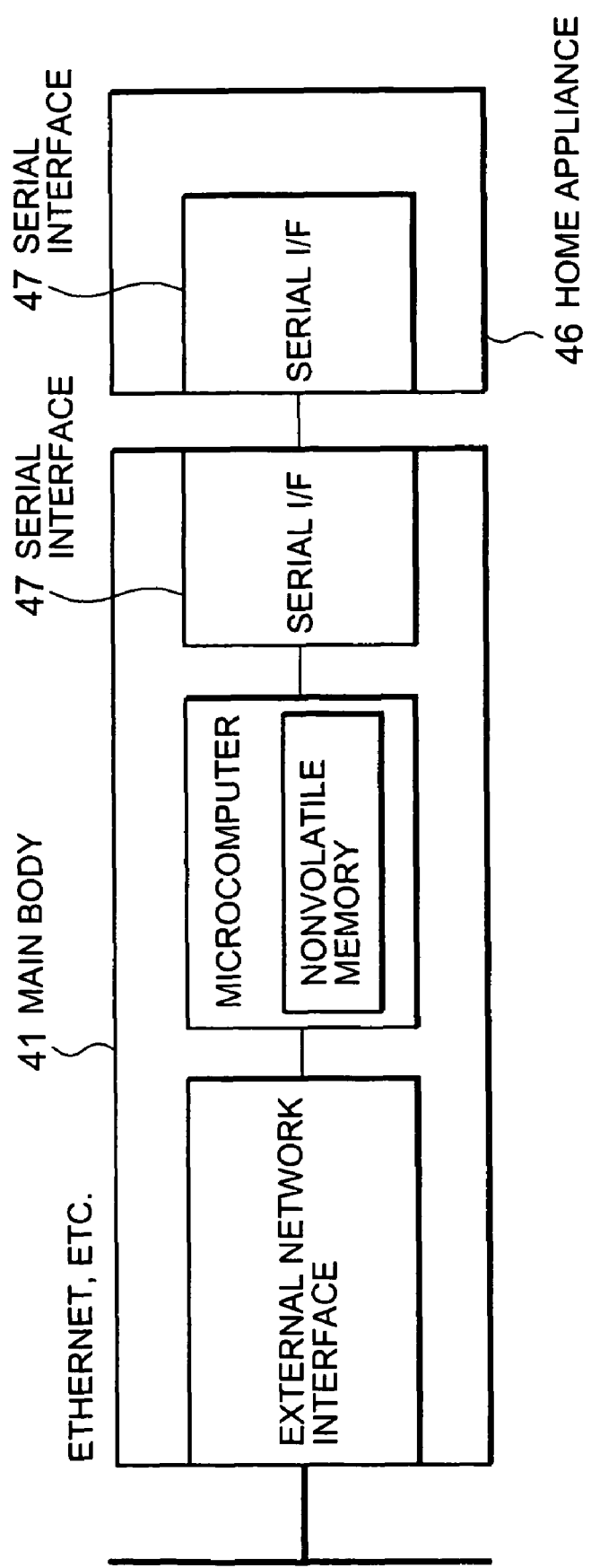
FIG. 14 is a diagram showing a state in which a home appliance is connected to an external network via an electrical apparatus (a communication adapter) according to a twelfth embodiment of the invention.

FIG. 14 shows a state in which a home appliance 46 is connected to an external apparatus via an electrical apparatus (a communication adapter) 41 according to this embodiment.

In the figure, the electrical apparatus (the communication adapter) 41 includes an external network interface connected to an external network such as Ethernet (registered trademark), a microcomputer incorporating a nonvolatile memory, and a serial interface 47 connected to the home appliance 46. The serial interface 47 for connection with the electrical apparatus (the communication adapter) 41 is also disposed in the home appliance 46.

With such a structure, the electrical apparatus (the communication adapter) 41 operates the home appliance 46 connected to the electrical apparatus itself according to a control signal from the external network interface and monitors a state of the home appliance 46 to notify other electrical appliances connected to the external network of information on this stated.

Figure 15:
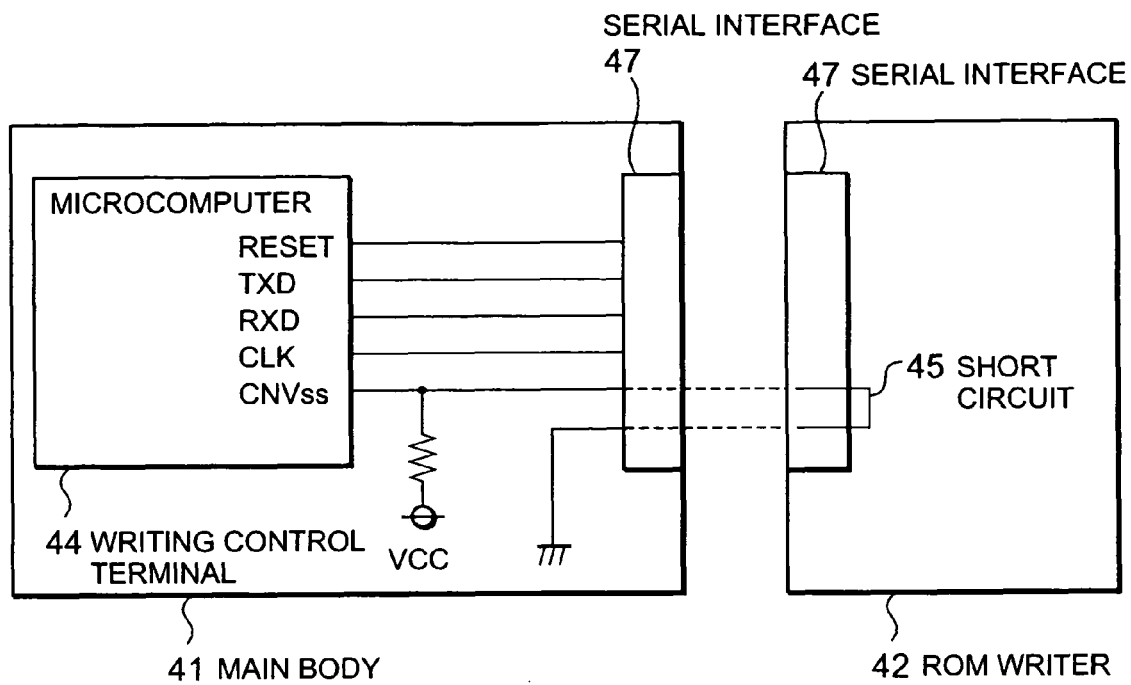
FIG. 15 is a diagram for explaining an operation for writing a program in a nonvolatile memory of the electrical apparatus according to the twelfth embodiment of the invention.

FIG. 15 is a diagram for explaining an operation for writing a program in the nonvolatile memory incorporated in the electrical apparatus 41. In the figure, a ROM writer 42 for writing a program in the nonvolatile memory is connected to the serial interface 47 of the electrical apparatus 41 instead of the home appliance 46.

In addition, a writing control terminal CNVss 44 is disposed in the electrical apparatus 41. A microcomputer, which is switched to a writing mode when the writing control terminal CNVss 44 is pulled down to a low potential level "L", is mounted on the electrical apparatus 41.

Writing of a program in the nonvolatile memory will be hereinafter explained on the basis of the figure.

The writing control terminal CNVss 44 of the electrical apparatus 41 is usually pulled up at a voltage VCC. The pulled-up writing control terminal CNVss 44 and a ground terminal (hereinafter referred to as "GND terminal") are outputted to the serial interface 47.

On the other hand, a short-circuit 45, through which the writing control terminal CNVss 44 and the GND terminal are short-circuited when the electrical apparatus 41 and the ROM writer 42 are connected, is disposed in a serial interface 47' of the ROM writer 42.

Therefore, by connecting the electrical apparatus 41 and the ROM writer 42, the writing control terminal CNVss 44 is short-circuited to be pulled down to the low potential level "L" and the microcomputer changes to the writing mode and can write a new program in the nonvolatile memory via a TXD (Transmitted Data) terminal or an RXD (Received Data) terminal.

In the explanation of this embodiment, the microcomputer changes to the writing mode by pulling down the writing control terminal CNVss 44 to the low potential level "L". The same holds true for a microcomputer that is switched to the writing mode by pulling up the writing control terminal CNVss 44 to a working voltage (5 V) of the microcomputer or a predetermined voltage of a common power supply line (12 V) on a circuit board.

Figure 16:
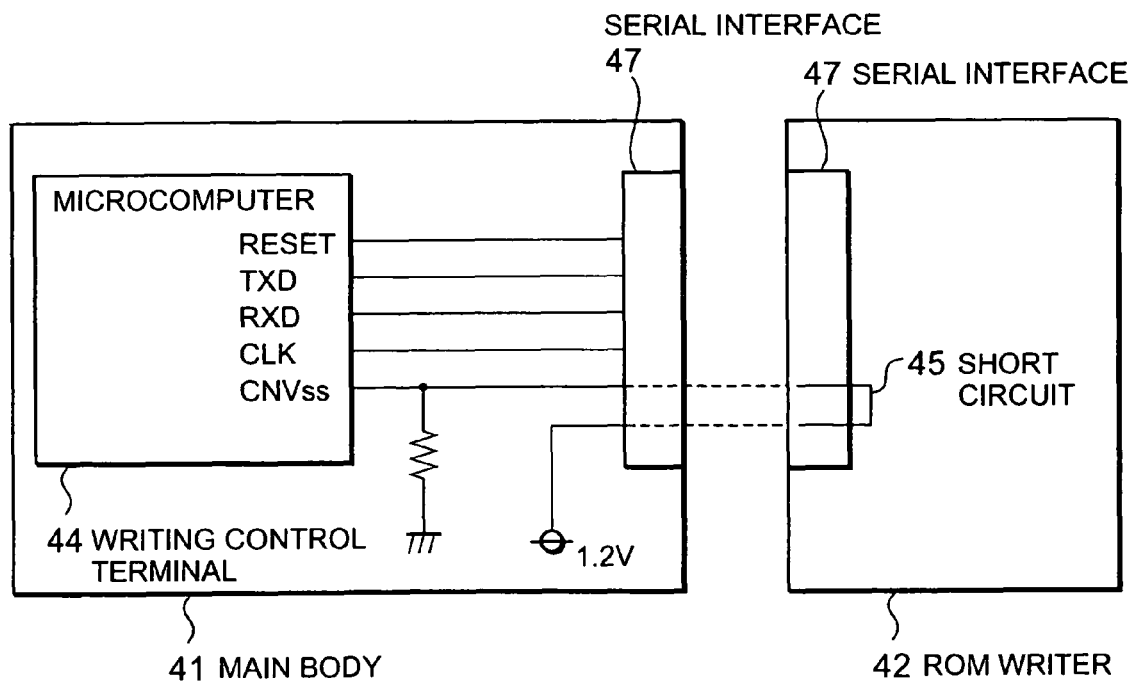
FIG. 16 is an explanatory diagram for explaining an operation for writing a program in a nonvolatile memory of another electrical apparatus according to the twelfth embodiment of the invention.

In this case, as shown in FIG. 16, the writing control terminal CNVss 44 is usually grounded. A terminal, to which a predetermined voltage is outputted, is disposed in the serial interface 47 on the electrical apparatus 41 side together with the writing control terminal CNVss 44. On the other hand, a short-circuit, through which the terminal with the predetermined voltage and the writing control terminal CNVss 44 are short-circuited when the electrical apparatus 41 and the ROM writer 42 are connected, is provided in the serial interface 47' on the ROM writer 42 side. With such a structure, it is possible to switch the microcomputer to the writing mode using the same ROM writer 42 as described above.

In this way, in the electrical apparatus 41 incorporating the nonvolatile memory according to the invention, the writing control terminal CNVss 44 and the voltage terminal, to which the predetermined voltage for switching the writing control terminal CNVss 44 is outputted, are disposed in the serial interface 47. The serial interface 47' of the ROM writer 42 is constituted such that the writing control terminal CNVss 44 and the voltage terminal are short-circuited when the serial interface 47' is connected to the electrical apparatus 41.

As a result, when the serial interfaces 47 and 47' are connected, regardless of specifications (pull-down, pull-up) of the microcomputer, the microcomputer always switches to the writing mode and shifts to a state in which the microcomputer can write a new program via the TXD terminal and the RXD terminal. In this way, it is possible to provide a ROM writer 42 and an electrical apparatus having high universality and a writing method using the ROM writer 42 and the electrical apparatus.

In the explanation of this embodiment, the communication adapter is cited as an example in this embodiment. However, the invention is not limited to this. For example, the same explanation is applied to a case in which the electrical apparatus is a home appliance such as an air conditioner or a microwave and, in order to write a new program in a nonvolatile memory of a microcomputer incorporated in this home appliance, the ROM writer 42 is connected to the serial interface 47 disposed in the home appliance to write the program.

In the explanation of this embodiment, one writing control terminal CNVss 44 is provided. However, the same explanation is applied to a case in which there are plural writing control terminals. When there are plural writing control terminals, a circuit for short-circuiting a GND terminal and a writing control terminal only has to be provided on the ROM writer 42 side for the respective writing control terminals.

Note that, in the explanation of this embodiment, the circuit for directly short-circuiting the writing control terminal CNVss 44 and the GND terminal is provided. However, it is needless to mention that any structure is acceptable as long as the writing control terminal CNVss 44 of the electrical apparatus 41 and the low potential level "L" is short-circuited when the electrical apparatus 41 and the ROM writer 42 are connected.

In embodiments to be described below, various cases in which the writing control terminal CNVss 44 is short-circuited when connected will be explained.

Thirteenth Embodiment

Figure 17:
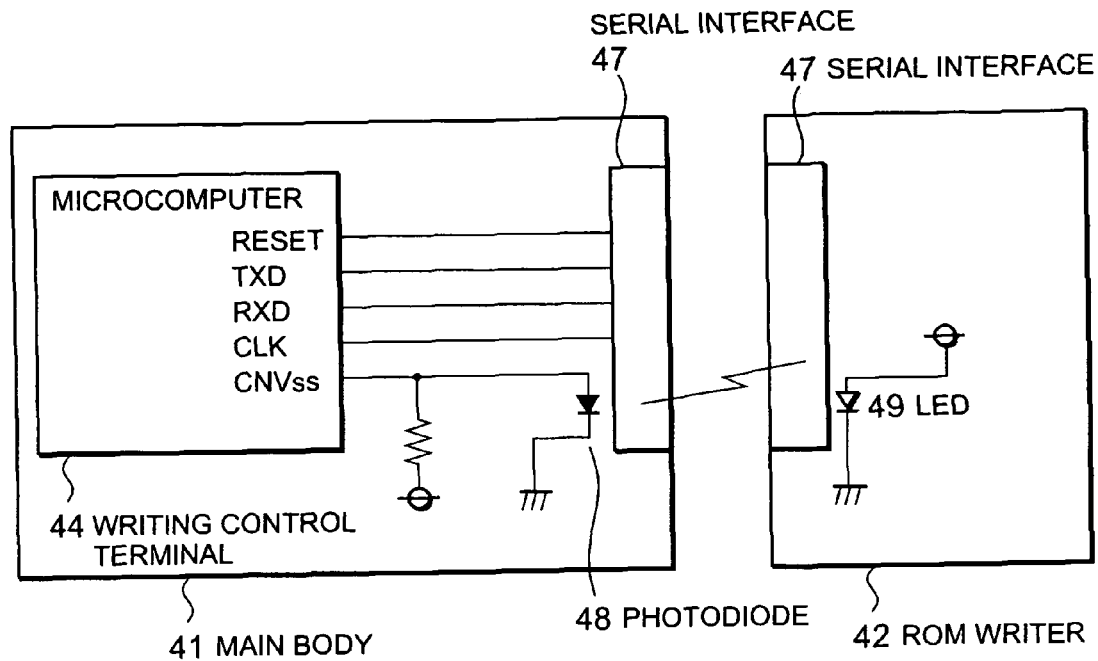
FIG. 17 is a diagram for explaining an operation for writing a program in a nonvolatile memory of an electrical apparatus according to a thirteenth embodiment of the invention.

In the twelfth embodiment, the writing control terminal CNVss 44 and the GND terminal are short-circuited via the short-circuit 45 to set the microcomputer to the writing mode. However, as shown in FIG. 17, it is also possible that a photodiode 48 is connected to the writing control terminal CNVss 44, an LED 49 is mounted on the ROM writer 42, the ROM writer 42 is connected to the serial interface 47 of the electrical apparatus 41, and when a new control program is written, the LED 49 is lighted to feed a photoelectric current to the photodiode 48 and set the writing control terminal CNVss 44 to the low potential level "L".

Figure 18:
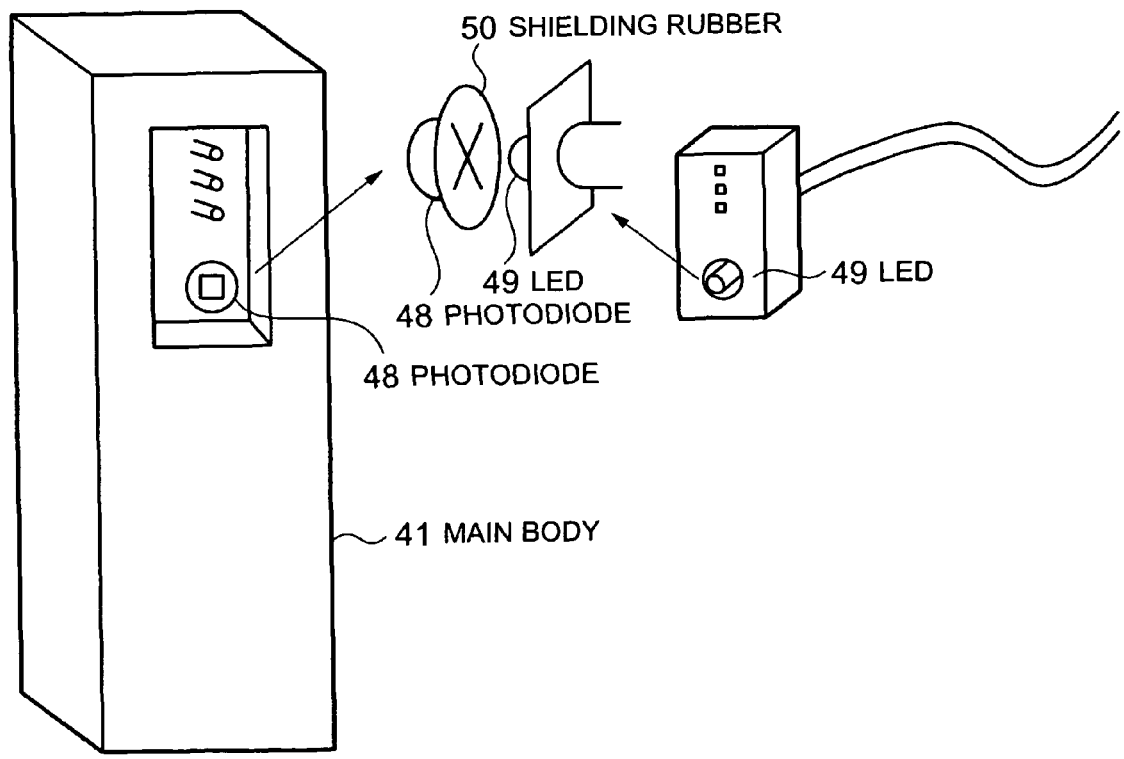
FIG. 18 is a diagram showing a structure of a part where the electrical apparatus and a ROM writer according to the thirteenth embodiment of the invention are connected.

As a structure of a connection part in the serial interfaces 47 of the ROM writer 42 and the electrical apparatus 41, for example, it is sufficient that the connection part is covered with a shielding rubber 50 at the time of normal use to prevent the microcomputer from changing to the writing mode as shown in FIG. 18 and the shielding rubber is pushed and removed by the LED 49 on the ROM writer 42 side such that light of the LED 49 is received by the photodiode 48 at the time of writing by the ROM writer 42.

As described above, in the electrical apparatus according to this embodiment, the low potential level "L" for switching the microcomputer to the writing mode is provided such that the writing control terminal is pulled down to the low potential level "L" when the photodiode receives light. Thus, as in the twelfth embodiment, the ROM writer 42 only has to have a light-emitting element such as an LED. It is unnecessary to change the ROM writer 42 according to specifications of the microcomputer of the electrical apparatus 41 and it is possible to provide the ROM writer 42 and an electrical apparatus having high universality and a writing method using the ROM writer 42 and the electrical apparatus.

Fourteenth Embodiment

Figure 19:
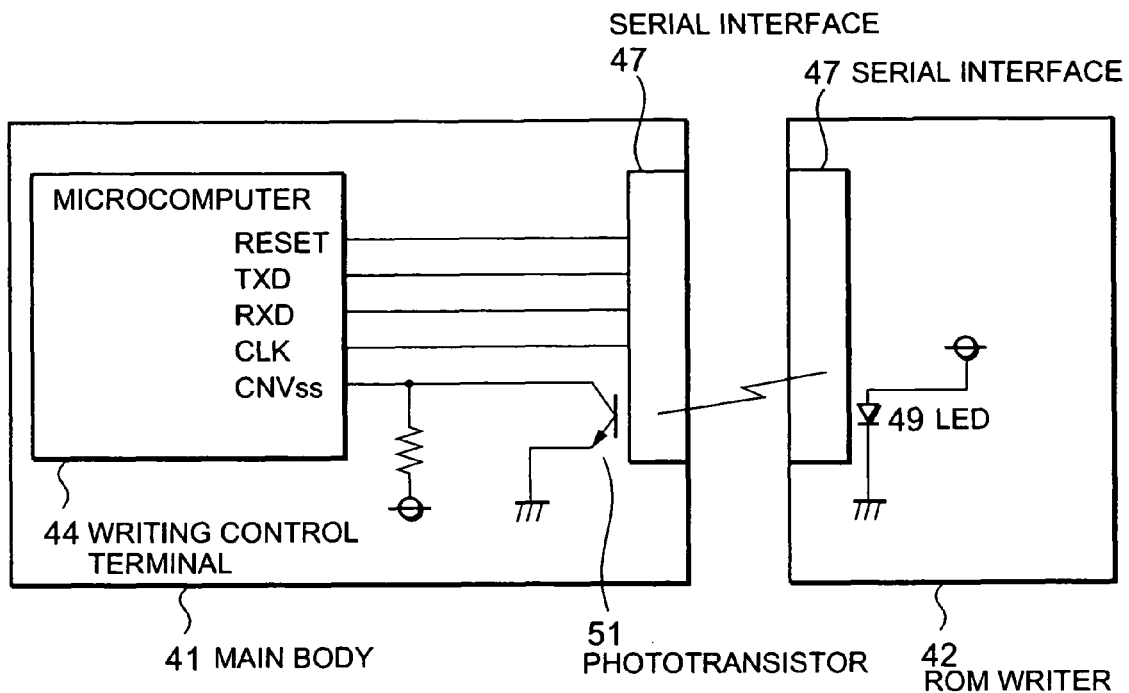
FIG. 19 is a diagram for explaining an operation for writing a program in a nonvolatile memory of an electrical apparatus according to a fourteenth embodiment of the invention.

In the thirteenth embodiment, optical coupling structure using the photodiode 48 is explained. However, as shown in FIG. 19, a phototransistor 51 may be used as a light-receiving element. The LED 49 is lighted to feed a photoelectric current to the phototransistor 51 instead of the photodiode 48, whereby the writing control terminal CNVss 44 is changed to the GND level. An advantage in this case is the same as that explained in the twelfth embodiment.

Fifteenth Embodiment

Figure 20:
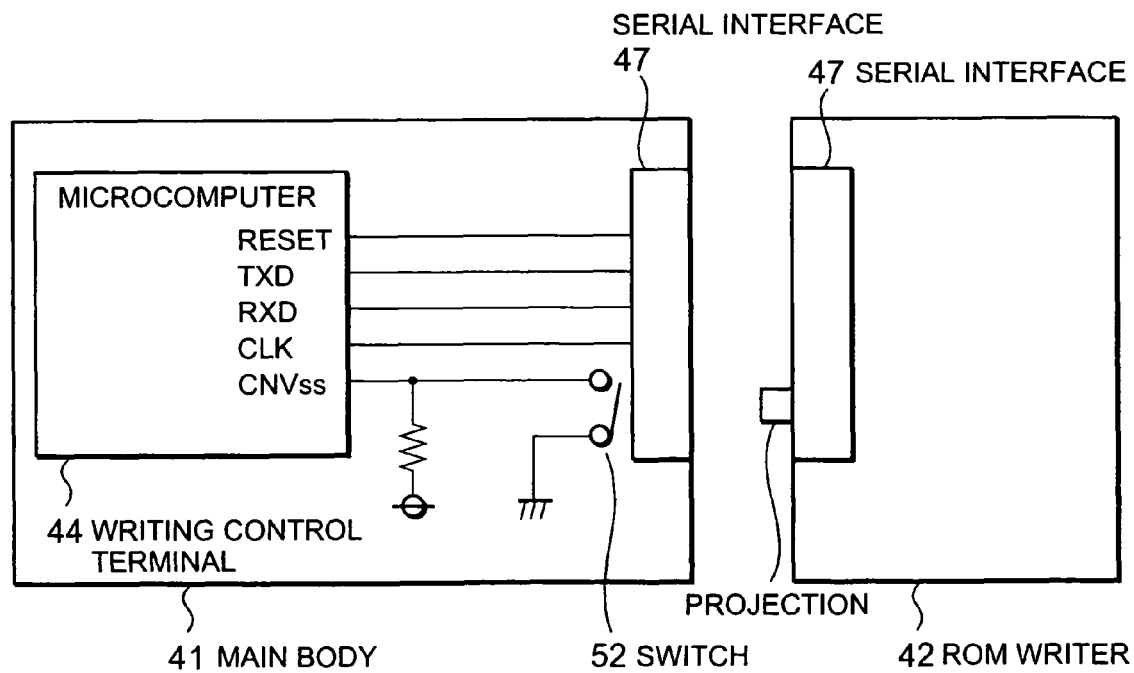
FIG. 20 is a diagram for explaining an operation for writing a program in a nonvolatile memory of an electrical apparatus according to a fifteenth embodiment of the invention.
Figure 21:
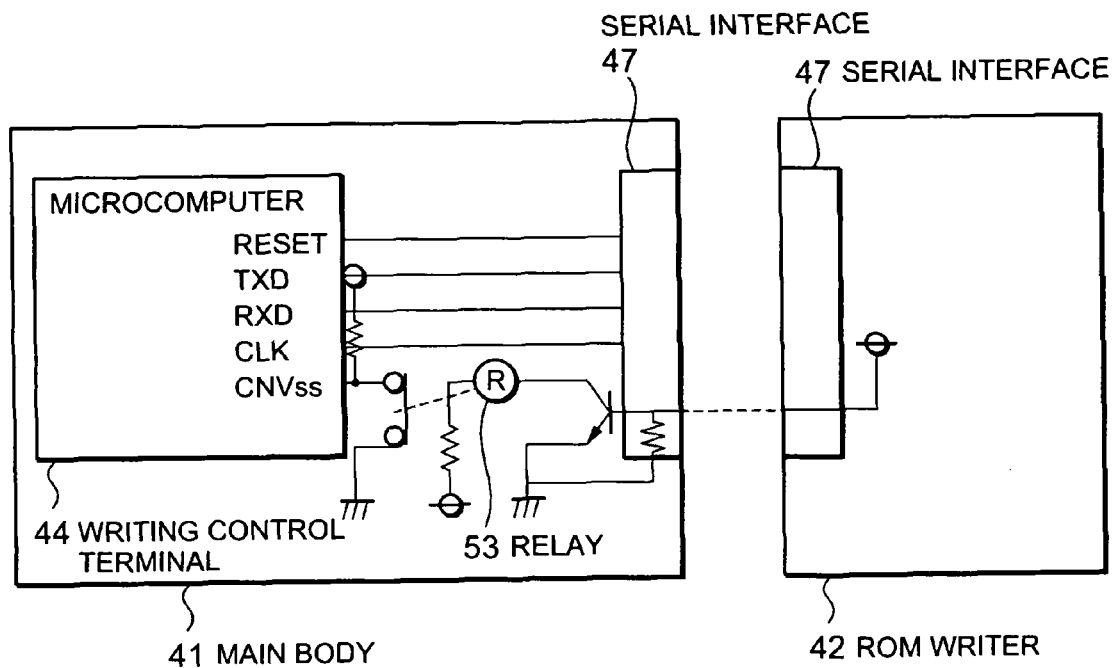
FIG. 21 is a diagram for explaining an operation for writing a program in a nonvolatile memory of an electrical apparatus according to a sixteenth embodiment of the invention.

In the twelfth embodiment, the writing control terminal CNVss 44 is short-circuited via the short-circuit 45 to set the writing control terminal CNVss 44 to a voltage level of the writing mode. However, as shown in FIG. 20, it is also possible that a mechanism switch 52, which is turned ON when pushed in, is connected to the writing control terminal CNVss 44 and exposed from the serial interface 47 and a projection making it possible to push in the switch is provided in the ROM writer 42 such that, when the ROM writer 42 is connected to a serial interface of a main body, the switch can be turned ON by the projection provided on the ROM writer 42 side. Since an advantage in this case is the same as that explained in the twelfth embodiment, an explanation of the advantage is omitted.

Sixteenth Embodiment

In the twelfth embodiment, the writing control terminal CNVss 44 is short-circuited via the short-circuit 45 to set the writing control terminal CNVss 44 to a voltage level of the writing mode. However, as shown in FIG. 8, it is also possible that a contact of a relay 53, which is open at the normal time, is connected to the writing control terminal CNVss 44 and a coil control line of the relay is outputted to the serial interface 47 side as a terminal such that, when the ROM writer 42 is connected to the serial interface 47 of the electrical apparatus 41, a voltage for operating the relay is applied to this coil control line, whereby the relay is turned ON and the writing control terminal CNVss 44 is pulled down to the GND level. An advantage in this case is the same as that explained in the twelfth embodiment.

Seventeenth Embodiment

Figure 22:
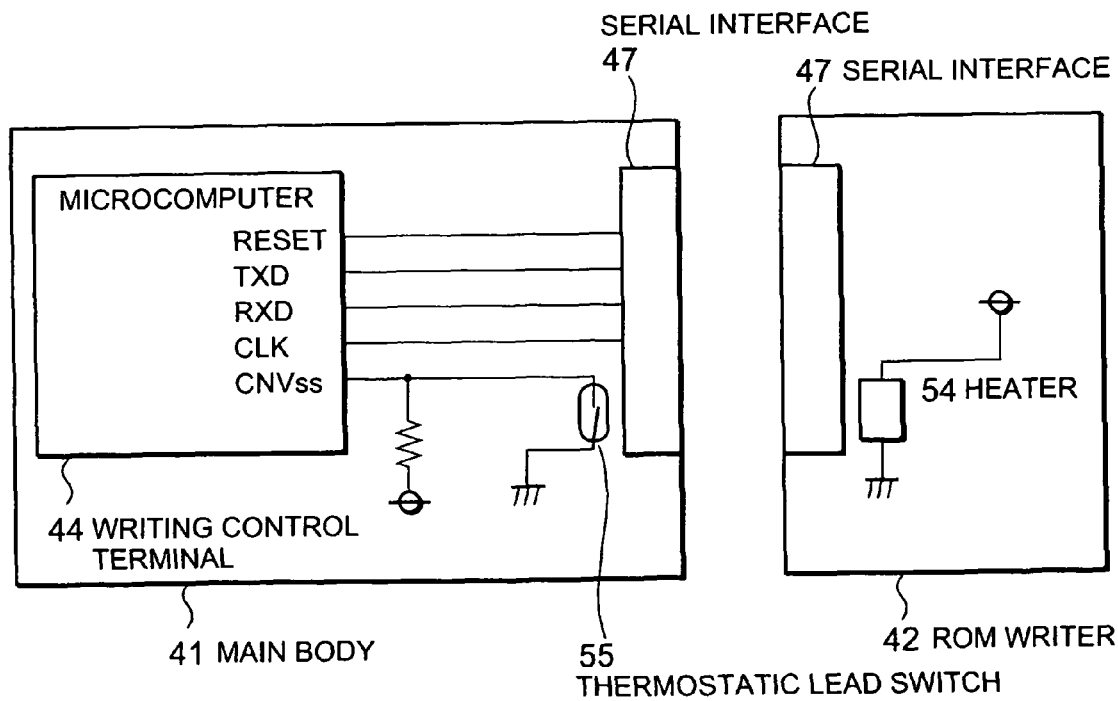
FIG. 22 is a diagram for explaining an operation for writing a program in a nonvolatile memory of an electrical apparatus according to a seventeenth embodiment of the invention.

In the twelfth embodiment, the writing control terminal CNVss 44 is short-circuited via the short-circuit 45 to set the writing control terminal CNVss 44 to a voltage level of the writing mode. However, as shown in FIG. 22, it is also possible that a thermostatic lead switch 55, which is open at a room temperature, is connected to the writing control terminal CNVss 44, a heater 54 is provided on the ROM writer 42 side, and when the ROM writer 42 is connected to the serial interface 47 of the electrical apparatus 41, the heater is turned ON to change the thermostatic lead switch 55 to a short-circuit mode with heat of the heater at the time of connection, whereby the writing control terminal CNVss 44 is grounded to GND and the microcomputer of the electrical apparatus 41 is set to the writing mode. An advantage in this case is the same as that explained in the twelfth embodiment.

Eighteenth Embodiment

Figure 23:
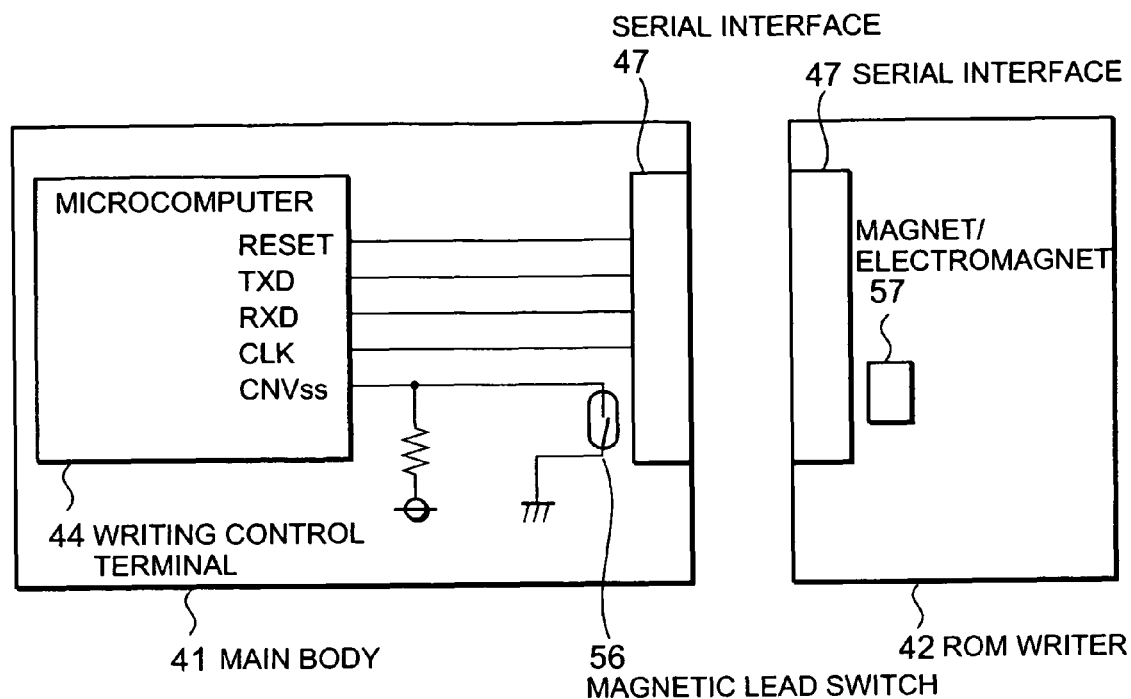
FIG. 23 is a diagram for explaining an operation for writing a program in a nonvolatile memory of an electrical apparatus according to an eighteenth embodiment of the invention.

In the seventeenth embodiment, as shown in FIG. 23, the writing control terminal CNVss 44 is controlled by the thermostatic lead switch 55. However, the writing control terminal CNVss 44 may be controlled by a magnetic lead switch 56. A permanent magnet or an electromagnet 57 is provided on the ROM writer 42 side and, when the ROM writer 42 is connected to the serial interface 47 of the electrical apparatus 41, the magnetic lead switch 56 is changed to the short-circuit mode by the permanent magnet 57, whereby the microcomputer of the electrical apparatus 41 is set to the writing mode.

In addition, when the electromagnet is provided on the ROM writer 42 side rather than the permanent magnet, it is also possible that, when the ROM writer 42 is connected to the serial interface 47 of the electrical apparatus 41, a magnetic force is generated by applying an electric current to a coil to short-circuit the magnetic lead switch. An advantage in this case is the same as that explained in the twelfth embodiment.

Nineteenth Embodiment

In the twelfth to the eighteenth embodiments, the method of directly short-circuiting the writing control terminal CNVss 44 and the GND terminal is explained. In this embodiment, a method of short-circuiting the writing control terminal CNVss 44 and the GND terminal by superimposing a control signal for short-circuiting the writing control terminal CNVss 44 to the GND level on a data signal transmitted from the ROM writer 42 to the TXD terminal and separating and extracting this control signal in the electrical apparatus 41 will be explained.

First, a structure and a function of the ROM writer 42 in this embodiment will be explained.

Figure 24:
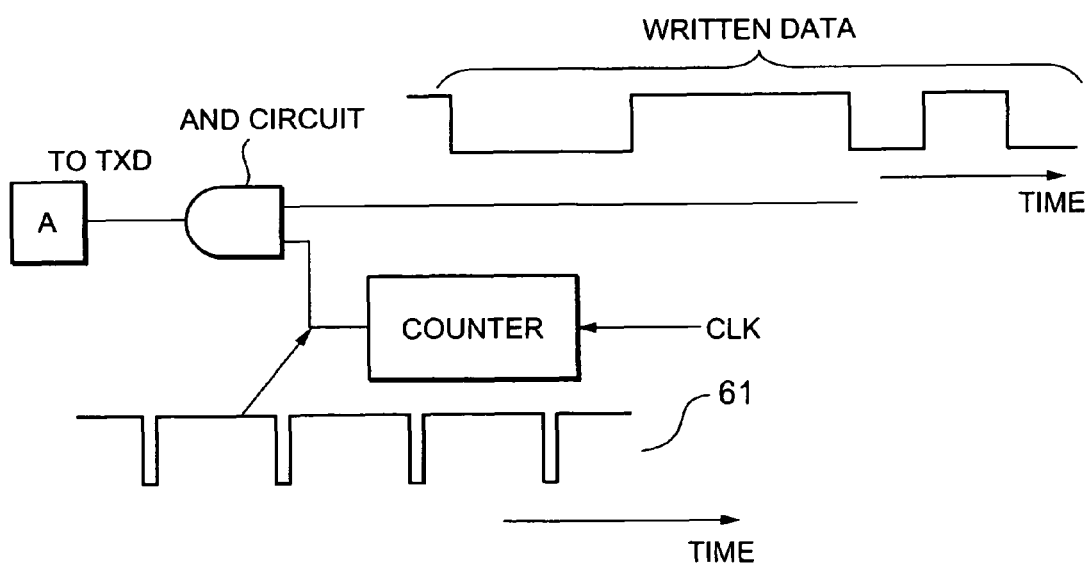
FIG. 24 is a diagram explaining signal generation by a ROM writer according to a nineteenth embodiment of the invention.

FIG. 24 is a diagram for explaining generation of a signal in the ROM writer 42.

In the figure, a signal 61 is generated from a counter circuit on the basis of a clock source with speed sufficiently larger than transfer speed of data transmitted to the TXD terminal (e.g., whereas the transfer speed of data transmitted to the TXD terminal is 1 bit/104 us, the speed of the clock source is 1 bit/1 us). The signal 61 and a data signal transmitted to the TXD terminal are inputted to an AND circuit to create a logical product of the two signals (an AND signal) Next, a structure and a function of the electrical apparatus 41 in this embodiment will be explained.

Figure 25:
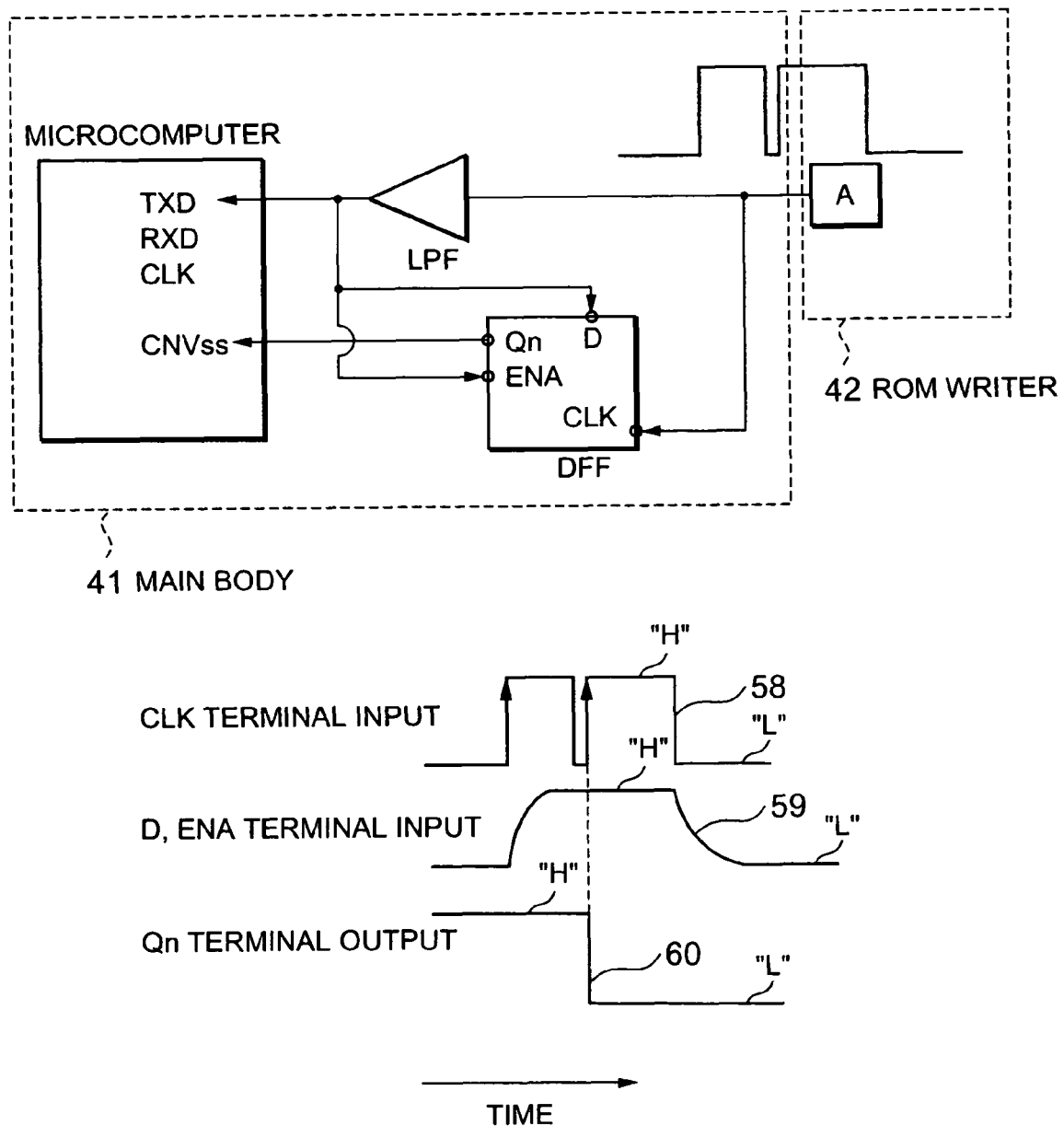
FIG. 25 is a diagram for explaining an operation for writing a program in a nonvolatile memory of an electrical apparatus according to the nineteenth embodiment of the invention.

FIG. 25 is a diagram explaining a component added to the electrical apparatus 41 and a function of the component (separating a signal transmitted from the ROM writer 2 into a data signal and a control signal to short-circuit the writing control terminal CNVss 44).

Compared with FIG. 14, a low-pass filter (hereinafter referred to as "LPF") and a D flip-flop (hereinafter referred to as "DFF") with an enable (ENA) are added to the electrical apparatus 41 anew.

An operation of the electrical apparatus 41 will be hereinafter explained in accordance with a flow of a signal.

The AND signal (a signal 58), which is created by the ROM writer 42 as described above, is branched into two signals and one signal is inputted to the LPF. A pulse of a small width, which is a high-frequency component, and the like are removed from the signal 58 inputted to the LPF. As a result, as indicated by a signal 59, a signal outputted from the LPF reproduces an original signal before inputted to the AND circuit, although slightly rounded at a rising edge and a falling edge. This signal 59 is inputted to the TXD terminal.

On the other hand, signals branched after passing the LPF are further branched and inputted to an ENA (ENABLE) terminal and a data input terminal (a D terminal) of the DFF, respectively. Signals branched before passing the LPF are directly inputted to the CLK terminal.

Here, in the DFF, while an input of the ENA terminal is a high potential level "H", an input of the D terminal is latched at a first rising edge of a waveform inputted from the CLK terminal. In other words, the high potential level "H" inputted to the D terminal at this point is directly outputted as an output of an output terminal (a Q terminal, not shown) Therefore, as indicated by a signal 60, an output from a reversal output terminal (a Qn terminal) is a lower potential level "L" that is obtained by reversing this high potential level "H". This means that the output of the Qn terminal is switched to the high potential level "H" to a low potential level "L" at the first rising edge of the waveform inputted from the CLK terminal. If the writing control terminal CNVss 44 is connected to the Qn terminal, the microcomputer is switched to the writing mode.

Once the output is changed to the low potential level "L", a reversal output of the DFF (an output from the Qn terminal) continues to be the low potential level "L" until the DFF is reset. Thus, after the writing ends, the DFF is reset.

In this way, it is also possible that the writing control terminal CNVss 44 is short-circuited to the ground level (the low potential level "L") using the flip-flop and the microcomputer of the electrical apparatus 41 is set to the writing mode.

Figure 26:
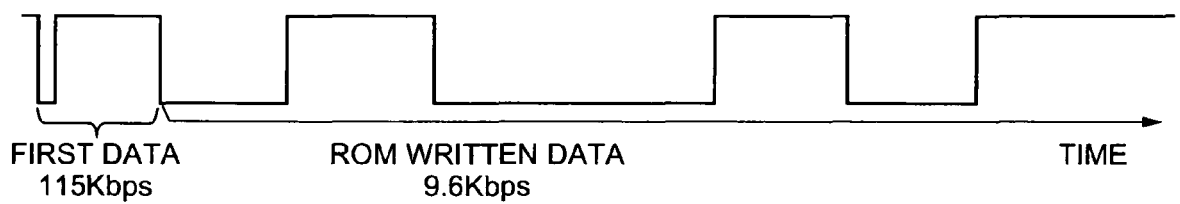
FIG. 26 is a diagram showing another example of a signal generated by the ROM writer according to the nineteenth embodiment of the invention.

As another method of generating a waveform to be inputted to the A terminal in FIG. 25, it is also possible that, as shown in FIG. 26, in the beginning at the time of start of writing from the ROM writer 42, transfer speed of a serial interface is set to 115 Kbps, all DATA are set to "1" such that only a start bit of a first time is detected with a structure of a UART (Universal Asynchronous Receiver/Transmitter) output format of "start bit+8 bit DATA" to generate a part of first data and, thereafter, data for writing a program is communicated by switching the transfer speed of the serial interface to 9.6 Kbps, whereby data from the ROM writer 42 to be transmitted to the electrical apparatus 41 is created. In this case, a first rising edge of the start bit is used for latching the D terminal. Note that a ratio of transfer speed (115 Kbps: 9.6 Kbps) is changed appropriately according to performance of the LPF.

Since the electrical apparatus 41 is constituted as described above, as in the twelfth embodiment, the low potential level "L" for switching the microcomputer to the writing mode is obtained from the electrical apparatus 41 and the control signal for operation the short-circuit consisting of the flip-flop circuit DFF is separated and extracted from the data signal of the ROM writer 42. Thus, it is unnecessary to change the ROM writer 42 according to specifications of the microcomputer of the electrical apparatus 41 and it is possible to provide the ROM writer 42 and an electrical apparatus having high universality and a writing method using the ROM writer 42 and the electrical apparatus.

Industrial Applicability

In the communication adapter apparatus according to the invention, the apparatus communication managing means has a function of managing an apparatus object mounted on an apparatus. Thus, a processing function realized by control means such as a microcomputer provided in the apparatus is reduced and it is possible to obtain an apparatus, which can be remotely operated from a network, by adding a communication adapter apparatus without imposing a burden on microcomputer resources. In addition, the apparatus communication managing means defies the means for connection with the communication control means according to a predetermined format and a predetermined procedure. Thus, there is also an advantage that, for example, even when a change of a communication protocol or the like occurs, a communication adapter apparatus with high universality, with which protocol change is possible easily, is obtained by creating the communication control unit according to a defined interface. Moreover, the communication adapter apparatus includes the power supply managing means and reduces power consumption in the inside thereof corresponding to a management state. Thus, for example, in the case of an apparatus that is required to be battery driven such as a sensor apparatus or when power is supplied from an apparatus, when there is limitation on a power supply, it is possible to secure operation within the limitation. Consequently, it is possible to obtain a communication adapter apparatus with which advantages such as control of an increase in cost of power supply to an apparatus and extension of a battery life are realized.

In the communication adapter, when an input/output interface of the communication adapter and an input/output interface of a home appliance are connected, a CPU of the communication adapter sets driver software for controlling interface hardware stored in a storage on the basis of power supply voltage information supplied from the home appliance via a specific terminal of the input/output interface. Thus, it is possible to automatically set attribute information without using a barcode and a barcode reader.

In the writing method consisting of an electrical apparatus incorporating a nonvolatile memory in which data is rewritable when a writing control terminal is pulled down or pulled up to a predetermined voltage and a ROM writer that writes data in this nonvolatile memory, the electrical apparatus includes a generation circuit for generating the predetermined voltage and the ROM writer includes means that connects the predetermined voltage generated by the generation circuit to the writing control terminal. Thus, it is unnecessary to change the ROM writer side according to specifications of a microcomputer of the electrical apparatus and it is possible provide a ROM writer and an electrical apparatus with high universality and a writing method using the ROM writer and the electrical apparatus.

The invention claimed is:

1. A communication adapter apparatus of a processor that connects one of plural connection object apparatuses having an apparatus object comprising information, which is based on functions of the apparatuses, and operable control items, respectively and a network to which a controller for remotely controlling the connection object apparatus is connected, comprising:
   a communication controller configured to control transmission and reception of data between the processor and the network;

an apparatus communication manager configured to copy and save the apparatus object, save a procedure for a communication service of the communication controller, and make it possible to use the connection object apparatus from the network using these saved data; and an apparatus interface defined by standards common to all the apparatuses in order to make all the plural connection object apparatuses connectable, wherein the apparatus communication manager includes:

an apparatus interface access unit that interfaces with the apparatus interface according to a procedure common to the connection object apparatuses;

an apparatus control access unit that interfaces with the communication controller according to the common procedure;

a second access controller configured to permit or prohibit an access to the apparatus control access unit from the communication controller based on an operation of the apparatus object of the connection object apparatus via the apparatus interface.

2. The communication adapter apparatus according to claim 1, further comprising:

a power supply manager configured to manage a charged capacity inside an adapter, wherein the communication controller limits communication according to a management state of the power supply manager.

3. The communication adapter apparatus according to claim 2, wherein the apparatus communication manager limits communication to the communication controller according to a state of the power supply manager using at least one of the apparatus interface access unit and the apparatus control access unit.

4. The communication adapter apparatus according to claim 1, further comprising:

a power supply manager configured to manage a charged capacity inside an adapter, wherein the apparatus communication manager limits accesses to the apparatus object according to a management state of the power supply manager.

5. The communication adapter apparatus according to claim 1, wherein each of the apparatus interface access unit and the apparatus control access unit includes at least one of object manager configured to perform management tasks including generation, deletion, and addition of instances and classes of the apparatus object, a state acquisition procedure setter configured to set setting values held by the connection object apparatuses, a procedure for acquiring notifications including a state, a state change, and a periodical notification, an installation information manager configured to set and provide information on installation or arrangement of the connection object apparatuses, a network attribute manager configured to set and provide attribute information concerning the network, and a network band manager configured to set and provide information related to a communication band of the network.

6. The communication adapter apparatus according to claim 1, wherein, when the connection object apparatuses are not yet connected, the apparatus communication manager generates an imaginary apparatus object on the basis of a setting command, transmission of which is received via the network, and saves the imaginary apparatus object instead of the apparatus object.

7. The communication adapter apparatus according to claim 1, wherein the apparatus communication manager provides an imaginary apparatus in the apparatus control access unit on the basis of a setting command, transmission of which is received via the network, performs operation and setting for this imaginary apparatus and acquisition of a state involved in the operation and setting, and performs setting for running and stopping of the apparatus object and acquisition of a state involved in the setting with the apparatus interface access unit.

8. The communication adapter apparatus according to claim 1, wherein the apparatus communication manager further includes:

a database that holds installation information for the apparatus object, and each of the apparatus interface access unit and the apparatus control access unit includes a writer/reader configured to write the installation information held by the database in and read out the installation information to the connection object apparatuses.

9. The communication adapter apparatus according to claim 1, wherein each of the apparatus interface access unit and the apparatus control access unit includes:

an abnormality notifier configured to detect in which of the apparatus interface; the communication controller; and the apparatus object abnormality has occurred and provide the network or the connection object apparatuses with information on the detected abnormality.

10. The communication adapter apparatus according to claim 9, wherein the communication adapter apparatus provides the network with the abnormality information when data transmission through the network is possible and provides the connection object apparatuses with the abnormality information when data transmission through the network is impossible.

* * * * *